US010304717B2

(12) United States Patent
Genetti et al.

(10) Patent No.: US 10,304,717 B2
(45) Date of Patent: May 28, 2019

(54) AUTOMATED REPLACEMENT OF CONSUMABLE PARTS USING INTERFACING CHAMBERS

(71) Applicant: Lam Research Corporation, Fremont, CA (US)

(72) Inventors: Damon Tyrone Genetti, Livermore, CA (US); Jon McChesney, Fremont, CA (US); Alex Paterson, San Jose, CA (US); Derek John Witkowicki, Newark, CA (US); Austin Ngo, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 106 days.

(21) Appl. No.: 15/668,673

(22) Filed: Aug. 3, 2017

(65) Prior Publication Data
US 2017/0330786 A1 Nov. 16, 2017

Related U.S. Application Data

(63) Continuation of application No. 15/048,960, filed on Feb. 19, 2016, now Pat. No. 10,062,599, which is a (Continued)

(51) Int. Cl.
*H01L 21/687* (2006.01)
*H01L 21/67* (2006.01)
(Continued)

(52) U.S. Cl.
CPC ...... *H01L 21/6875* (2013.01); *H01L 21/6719* (2013.01); *H01L 21/67196* (2013.01); (Continued)

(58) Field of Classification Search
None
See application file for complete search history.

(56) References Cited

U.S. PATENT DOCUMENTS 4,930,634 A 6/1990 Williams et al.
5,788,082 A 8/1998 Nyseth
(Continued)

*Primary Examiner* — Asok K Sarkar
(74) *Attorney, Agent, or Firm* — Penilla IP, APC

(57) ABSTRACT

A cluster tool assembly includes a vacuum transfer module, a process module having a first side connected to the vacuum transfer module. An isolation valve having a first side and a second side, the first side of the isolation valve coupled to a second side of the process module. A replacement station is coupled to the second side of the isolation valve. The replacement station includes an exchange handler and a part buffer. The part buffer includes a plurality of compartments to hold new or used consumable parts. The process module includes a lift mechanism to enable placement of a consumable part installed in the process module to a raised position. The raised position provides access to the exchange handler to enable removal of the consumable part from the process module and store in a compartment of the part buffer. The exchange handler of the replacement station is configured to provide a replacement for the consumable part from the part buffer back to the process module. The lift mechanism is configured to receive the consumable part provided for replacement by the exchange handler and lower the consumable part to an installed position. The replacement by the exchange handler and the process module is conducted while the process module and the replacement station are maintained in a vacuum state.

20 Claims, 18 Drawing Sheets

Related U.S. Application Data continuation-in-part of application No. 14/920,090, filed on Oct. 22, 2015, now abandoned.

(51) Int. Cl.
*H01L 21/677* (2006.01)
*H01L 21/673* (2006.01)
*H01L 21/683* (2006.01)

(52) U.S. Cl.
CPC .. *H01L 21/67201* (2013.01); *H01L 21/67386* (2013.01); *H01L 21/67742* (2013.01); *H01L 21/68707* (2013.01); *H01L 21/68735* (2013.01); *H01L 21/68785* (2013.01); *H01L 21/6838* (2013.01)

(56) References Cited

U.S. PATENT DOCUMENTS

| | | |
|---|---|---|
| 6,010,008 A | 1/2000 | Nyseth et al. |
| 6,092,981 A | 7/2000 | Pfeiffer et al. |
| 6,267,245 B1 | 7/2001 | Bores et al. |
| 6,776,289 B1 | 8/2004 | Nyseth |
| 7,121,414 B2 | 10/2006 | Beckhart et al. |
| 7,950,524 B2 | 5/2011 | Lin et al. |
| 8,919,563 B2 | 12/2014 | Gregerson et al. |
| 9,881,820 B2* | 1/2018 | Wong ................ H01L 21/67167 |
| 10,062,589 B2* | 8/2018 | Wong ................ H01L 21/67167 |
| 10,062,590 B2* | 8/2018 | Wong ................ H01L 21/67167 |
| 10,062,599 B2* | 8/2018 | Genetti ............ H01L 21/67742 |
| 2004/0242126 A1 | 12/2004 | Takeuchi |
| 2005/0205209 A1 | 9/2005 | Mosden |
| 2006/0151404 A1 | 7/2006 | Blattner et al. |
| 2009/0003976 A1 | 1/2009 | Hofmeister et al. |
| 2009/0142163 A1 | 6/2009 | Genetti et al. |
| 2010/0032096 A1 | 2/2010 | Yu et al. |
| 2010/0267317 A1 | 10/2010 | Takahashi et al. |
| 2012/0070996 A1 | 3/2012 | Hao |
| 2013/0308929 A1 | 11/2013 | Hsiao |
| 2017/0113355 A1 | 4/2017 | Genetti et al. |
| 2017/0117172 A1 | 4/2017 | Genetti et al. |

* cited by examiner

ATM and/or VTM robot end-effector – with fingers sized to support a wafer
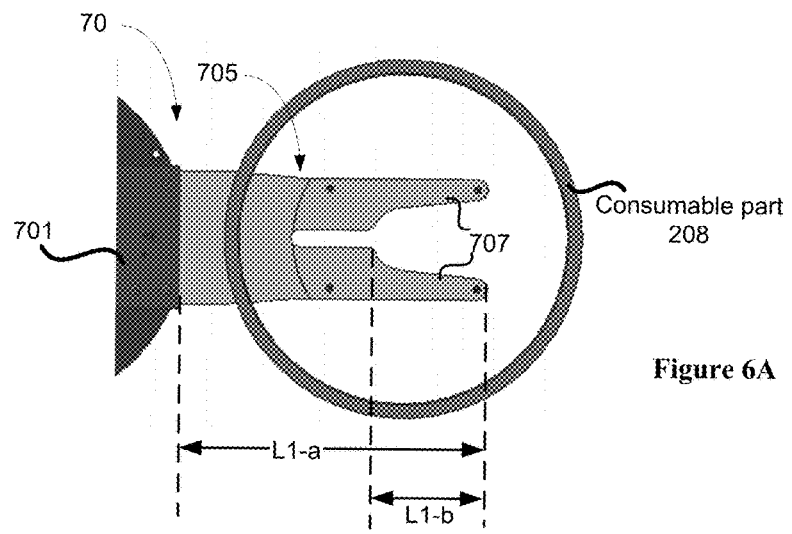
Figure 6A
ATM and/or VTM robot end-effector (with extended fingers, wrist plate and mounting arm)
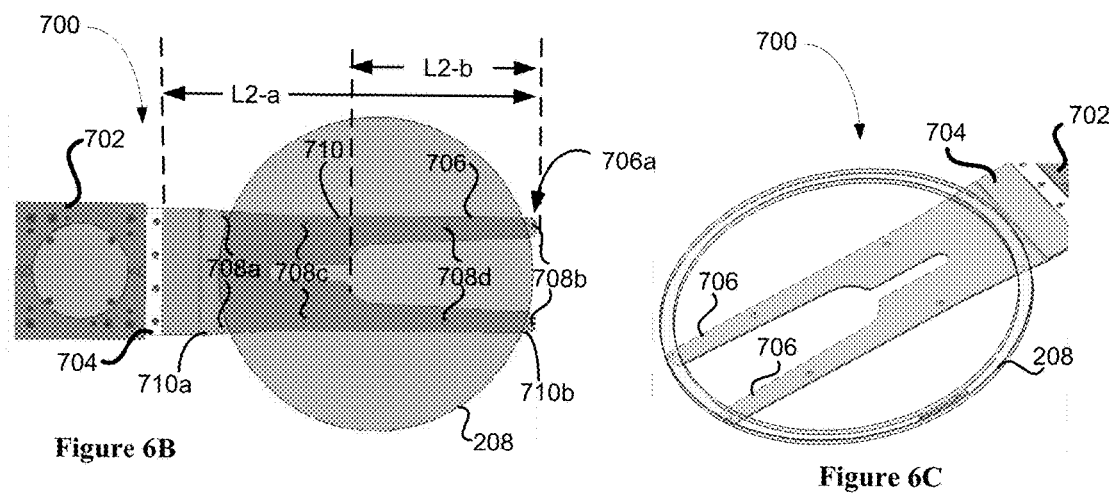
Figure 6B
Figure 6C
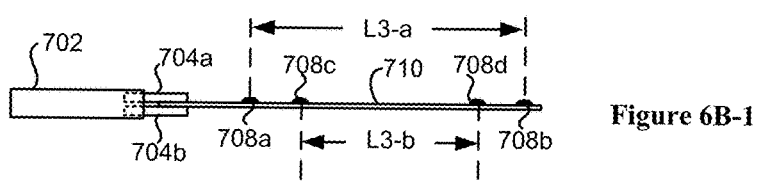
Figure 6B-1

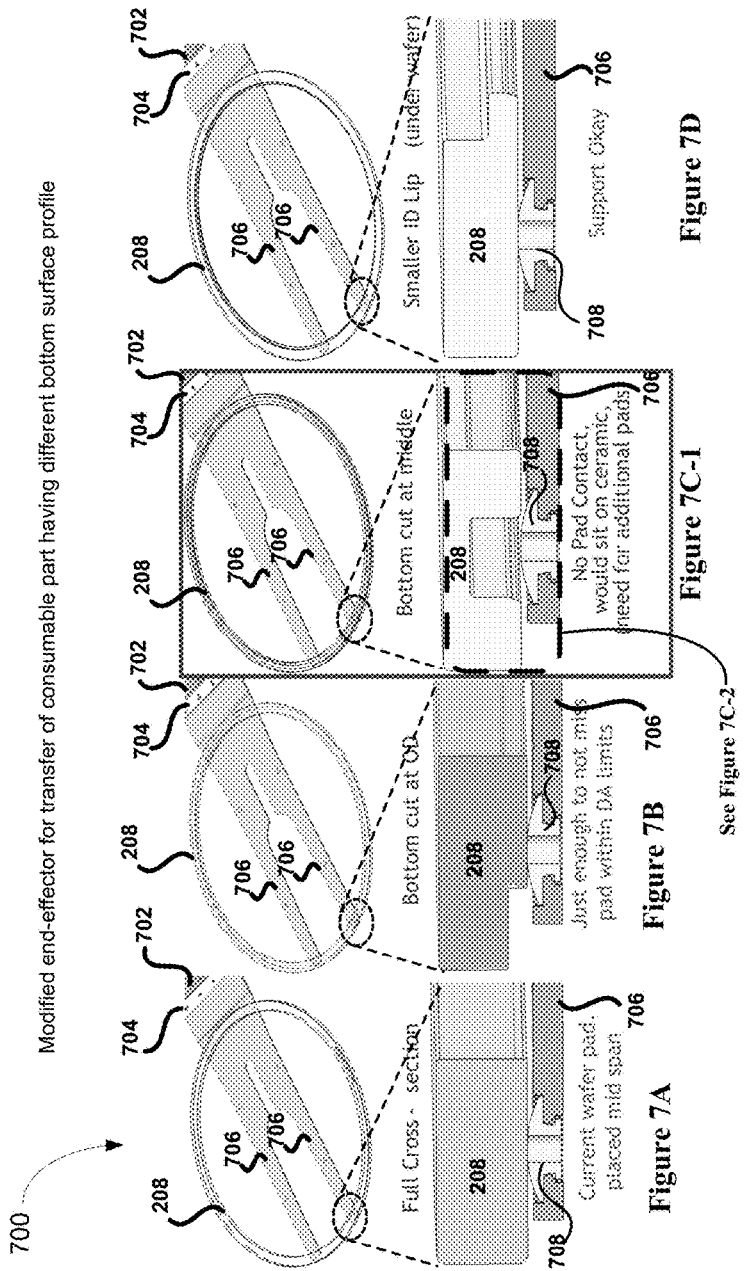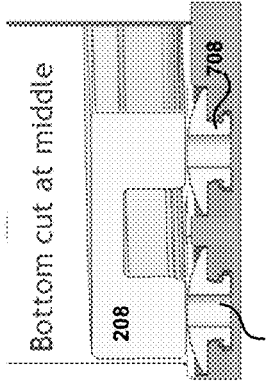
Figure 7A, Figure 7B, Figure 7C-1, Figure 7C-2, Figure 7D

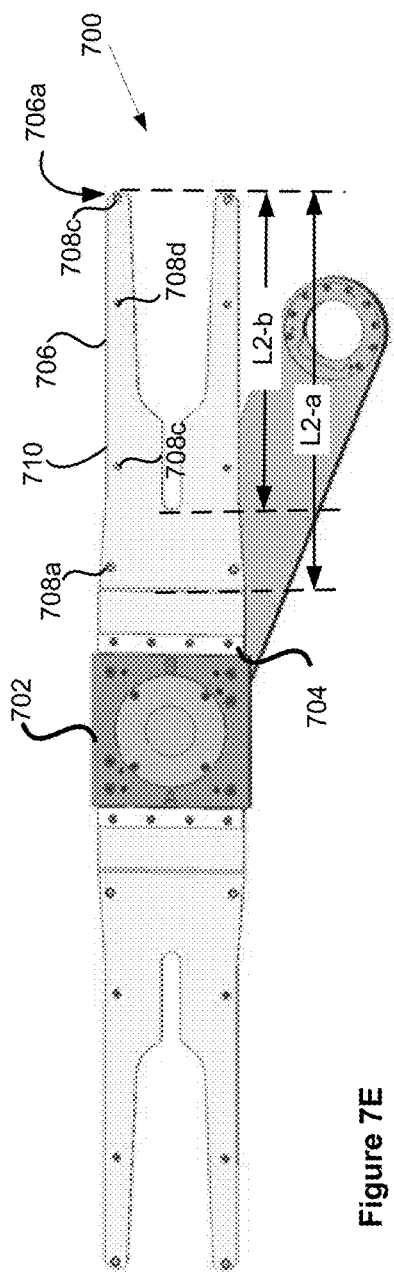
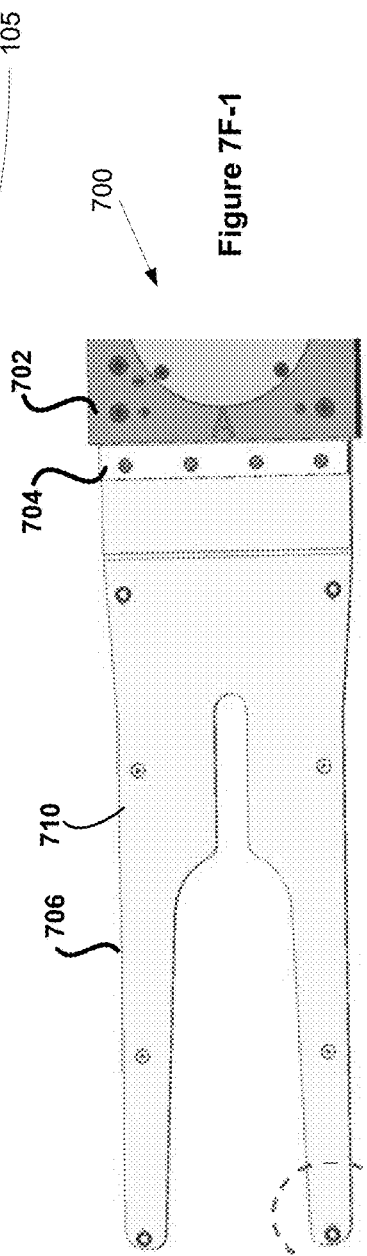
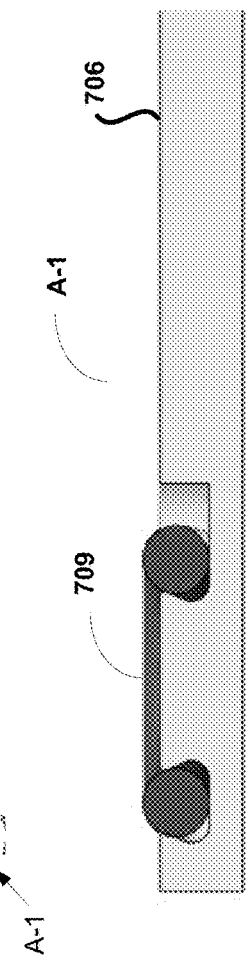
Figure 7E
Figure 7F-1
Figure 7F-2

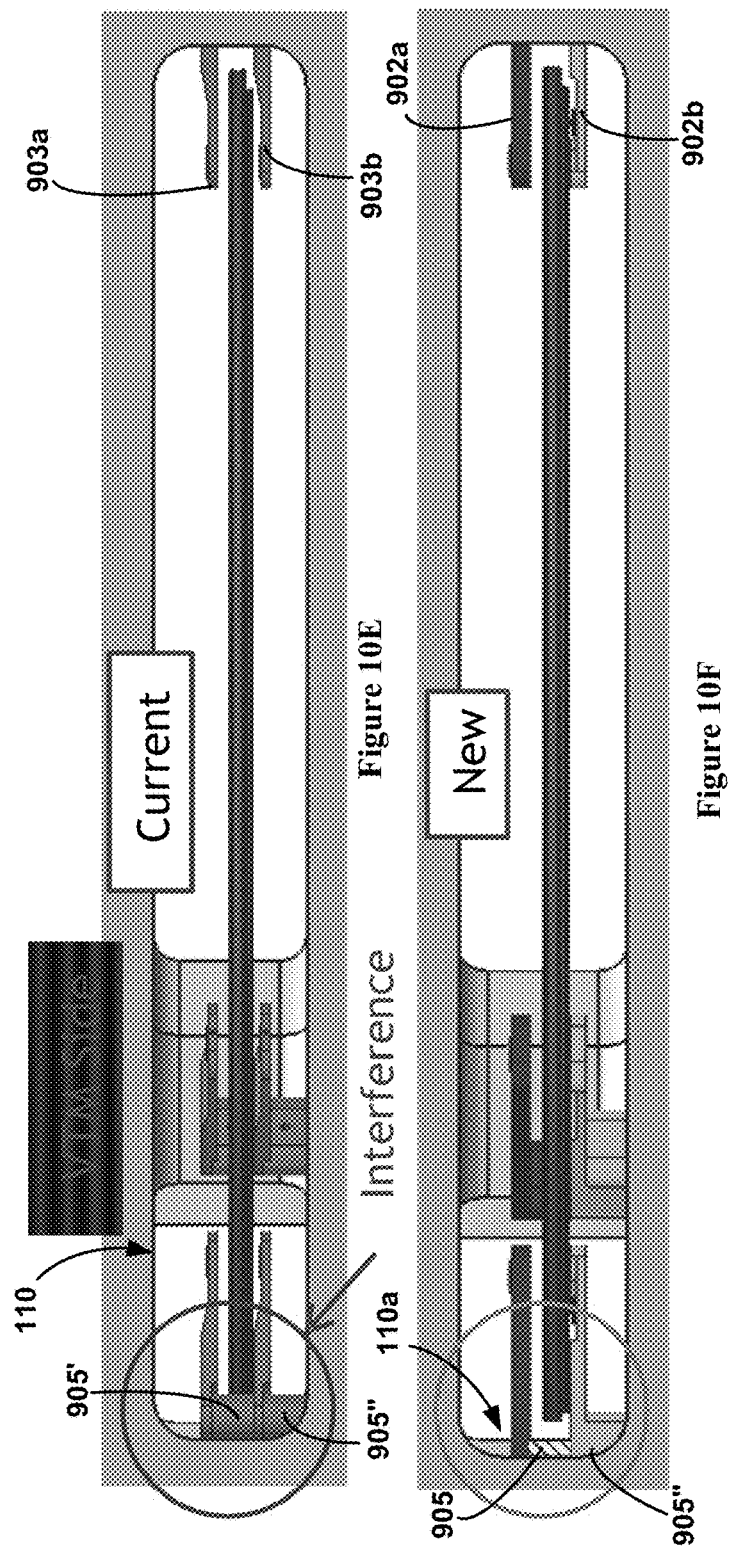

AUTOMATED REPLACEMENT OF CONSUMABLE PARTS USING INTERFACING CHAMBERS

CLAIM OF PRIORITY

This application is a continuation of and claims priority to U.S. patent application Ser. No. 15/048,960, filed on Feb. 19, 2016, and entitled, "Automated Replacement of Consumable Parts Using Interfacing Chambers, which is a continuation in part of U.S. patent application Ser. No. 14/920,090, filed on Oct. 22, 2015, and entitled, "Systems for Removing and Replacing Consumable Parts from a Semiconductor Process Module in Situ", which are incorporated herein by reference in entirety for all purposes.

CROSS REFERENCE TO RELATED APPLICATIONS

This application is related to application Ser. No. 15/048,940 (Attorney Docket No. LAM2P900.B), filed on Feb. 19, 2016, and titled, "Automated Replacement of Consumable Parts Using End Effectors Interfacing with Plasma Processing System", and application Ser. No. 15/138,097, filed on Apr. 25, 2016, and entitled, "Front Opening Ring Pod," which are incorporated herein by reference in entirety for all purposes.

BACKGROUND

1. Field of the Invention

The present embodiments relate to a cluster tool assembly used in manufacturing semiconductor wafer, and more particularly, to cluster tool assembly that enables removal and replacement of consumable parts within a process module disposed in the cluster tool assembly.

2. Description of the Related Art

A typical cluster tool assembly used in the manufacturing process to generate a semiconductor wafer includes one or more process modules with each process module used to perform a specific manufacturing operation, such as a cleaning operation, a deposition, an etching operation, a rinsing operation, a drying operation, etc. The chemistries and/or processing conditions used to perform these operations cause damage to some of the hardware components of the process module that are constantly exposed to the harsh conditions within the process module. These damaged or worn out hardware components need to be replaced promptly to ensure that the damaged hardware components do not expose other hardware components in the process module to the harsh conditions, and to ensure quality of the semiconductor wafer. For example, an edge ring that is disposed adjacent to a semiconductor wafer within a process module may get damaged frequently due to its location and continuous exposure to ion bombardment from a plasma generated within the process module that is used in an etching operation. The damaged edge ring needs to be replaced promptly to ensure that the damaged edge ring does not expose the underlying hardware components, such as a chuck, to the harsh process conditions. The hardware components that can be replaced are referred to herein as consumable parts.

The current process of replacing the damaged consumable part requires a trained service technician to perform a series of steps. The technician needs to bring the cluster tool assembly offline, pump/purge the cluster tool assembly to avoid exposure to toxic residuals, open the cluster tool, remove the damaged consumable part and replace the damaged consumable part with a new consumable part. Once the damaged part is replaced, the technician must then clean the cluster tool, pump the cluster tool assembly to vacuum and condition the cluster tool assembly for wafer processing. In some instances, the conditioning may involve qualifying the cluster tool assembly by running test process on the semiconductor wafer, taking cross-sections of the semiconductor wafer and analyzing the cross-sections to ensure the quality of the process operation. Replacing a damaged consumable part is a very involved and time-consuming process requiring the cluster tool assembly to be off-line for a considerable amount of time, thereby impacting the profit margin for a semiconductor manufacturer.

It is in this context that embodiments of the invention arise.

SUMMARY

Embodiments of the invention define a cluster tool assembly and an end effector mechanism provided in the cluster tool assembly that is designed to remove and replace damaged hardware components of a process module disposed within the cluster tool assembly without a need to break vacuum (i.e., expose the cluster tool assembly to atmospheric condition). A damaged hardware component that can be replaced is also referred to herein as a consumable part. The cluster tool assembly includes one or more process modules, with each process module configured to perform a semiconductor wafer processing operation. As the consumable part in a process module gets exposed to the chemicals and process conditions, the consumable part gets damaged and needs to be replaced in a timely manner. The damaged consumable part may be replaced without opening the cluster tool assembly by mounting a replacement station to the cluster tool assembly. The replacement station includes a part buffer with compartments that are used to store new and used consumable parts. The replacement station and the process module(s) are coupled to a controller to enable the controller to coordinate access between the replacement station and the process module(s) while the process module(s) is maintained in a vacuum state, so as to allow replacement of the consumable part.

To provide easy access to the damaged consumable part, the process module may be designed to include a lift mechanism. When engaged, the lift mechanism is configured to allow the consumable part to be moved to a raised position so that a robot available within the cluster tool assembly may be used to access and retrieve the raised consumable part from the process module. A replacement consumable part is provided to the process module and the lift mechanism is used to receive the consumable part and lower it into position in the process module.

By providing the replacement station to access the consumable part, a need to open the cluster tool assembly to atmospheric conditions in order to access the damaged consumable part, is eliminated. The replacement station is maintained at vacuum, in some implementations, thereby eliminating the risk of contamination during replacement of the consumable part. As a result, the time required to recondition the process module to bring it to an active operation state after replacement of the damaged consumable part, is substantially reduced. Further, the robot and the lift mechanism allow replacement of the consumable part without the risk of inadvertently damaging any hardware components of the process modules during retrieval and replacement of the consumable part.

Embodiments of the disclosure provide a cluster tool assembly that can be used to remove and replace the consumable part from a process module without requiring the cluster tool assembly to be opened to atmospheric conditions. As the cluster tool assembly is not opened, the cluster tool assembly does not require to be purged or pumped. As a result, the time required to condition and qualify the cluster tool assembly is considerably reduced.

The replacement station may be disposed in three different positions. In one position, a roll-up replacement station is temporarily mounted directly to a process module within a cluster tool assembly, with ability to pump to vacuum and retract the consumable part directly from the process module. A new consumable part is retrieved from the replacement station and directly placed into the process module. In this position, the replacement station would include a robot and part buffer for holding used and new consumable parts. An isolation valve would remain on the process module. This configuration is desired since only the process module, not the entire cluster tool assembly, would have to be offline for this maintenance activity.

In a second position, the replacement station is permanently mounted to a vacuum transfer module (VTM) and a robot within the VTM is utilized to remove and replace the consumable part from the process module. In this position, the replacement station does not require a dedicated robot, but an end effector of the VTM robot would handle moving both semiconductor wafers and the consumable parts.

In a third position, the replacement station is temporarily or permanently mounted to an atmospheric transfer module (ATM) and a robot of the ATM, a robot of a vacuum transfer module (VTM) are used to remove and replace the consumable part from the process module. In this position, the replacement station would not require a dedicated robotic arm, but the VTM and ATM robot end effectors, as well as a loadlock chamber disposed between the ATM and the VTM would handle both the semiconductor wafers and the consumable parts.

The process module includes a consumable part lift mechanism. The consumable part is usually a ring, such as an edge ring. The consumable part would have to be lifted so that a robot could easily access and extract it. In one embodiment, the lift mechanism includes a vacuum-sealed actuator outfitted with a lift pin. In another embodiment, the actuator is maintained at vacuum. Under normal operation, the lift stays retracted and not in contact with the consumable part. When the consumable part needs to be replaced, the actuator extends the lift pin and raises the consumable part. The robot extends the end effector into the process module so that the end effector (for example, a spatula-shaped or finger-shaped part attached to the robot) slides underneath the consumable part. The actuator then retracts the lift pin, placing the consumable part on the end effector. The consumable part is pulled back into the replacement station. A reverse order is used to place a new consumable part in the process module.

In one embodiment, a front opening ring pod (FORP) for holding consumable parts used in a processing tool, is disclosed. The FORP includes a plurality of compartments disposed within for holding consumable parts in a vertically stacked orientation. A plurality of ledges disposed along internal sidewalls of the FORP defines shelves for supporting the consumable parts in the vertically stacked orientation. A separator plate disposed within the FORP provides a horizontal plane that divides an inside region of the FORP into an upper region and a lower region, such that each of the upper region and the lower region include a group of said shelves for holding the consumable parts. A vent is defined in a base of the FORP. The vent provides a path for gases out of the lower region of the FORP.

In another embodiment, a front opening ring pod (FORP for holding consumable parts used in a processing tool, is disclosed. The FORP includes a plurality of compartments for holding consumable parts in a vertically stacked orientation within the FORP. A plurality of ledges disposed vertically along internal lateral sidewalls and an internal back sidewall of the FORP define shelves for supporting the consumable parts in the vertically stacked orientation. An opening with a door frame is provided on a front sidewall of the FORP. The opening is configured to receive a door. The opening is sized to provide access in and out for the consumable parts held in the FORP. A separator plate disposed within the FORP provides a horizontal plane that divides an inside region of the FORP into an upper region and a lower region, wherein each of the upper region and the lower region include a group of said shelves for holding the consumable parts. A vent is defined in a base of the FORP. The vent provides a path for gases out of the lower region of the FORP.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

FIG. 6A illustrates an end-effector mechanism used within an ATM that is configured to receive a substrate, and FIGS. 6B, 6B-1 and 6C illustrate overhead and side view of an end effector mechanism disposed in an atmospheric transfer module and/or a vacuum transfer module, in some embodiments of the invention.

FIGS. 7A-7D illustrate varying bottom surface profile of a consumable part that is received using end effector mechanism, in accordance with some embodiments of the invention.

FIG. 7E illustrates an example end effector mechanism on a robot of a VTM, in accordance with some embodiments of the inventions.

FIGS. 7F-1, 7F-2 illustrates an alternate contact pad concept used in the end effector mechanism on a robot of a VTM and/or an ATM for supporting consumable parts with different bottom profiles, in accordance with some embodiments of the invention.

FIGS. 10E-10F illustrate a view of an existing airlock chamber and a re-designed airlock chamber that includes finger assemblies to receive consumable part, in accordance to some embodiments of the invention.

DESCRIPTION

Figure 1:
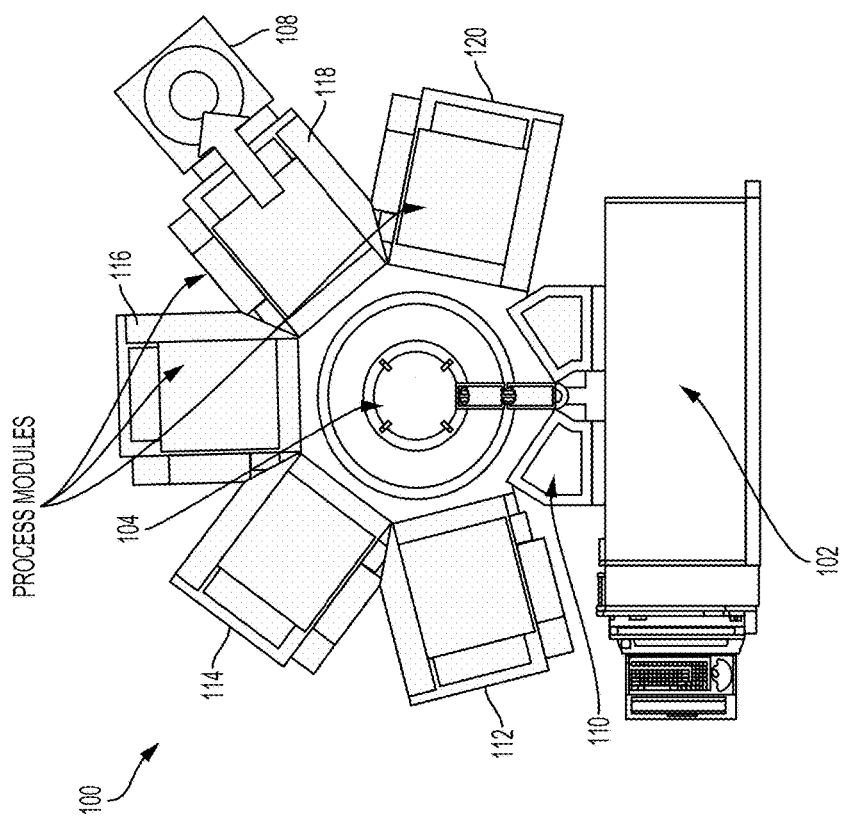
FIG. 1 illustrates a simplified block diagram of a cluster tool assembly that includes a replacement station mounted to a process module that is used in processing a semiconductor wafer, in one embodiment of the invention.

Embodiments of the disclosure define a cluster tool assembly that is used to process a semiconductor wafer. The cluster tool assembly includes a process module that is used to process a semiconductor wafer. A replacement station is mounted to the cluster tool assembly. The replacement station is maintained at vacuum so as to provide the necessary process condition for replacement of the consumable part without risk of contaminating the process module or the cluster tool assembly. A dedicated robot within the replacement station or the robot available within the cluster tool assembly is used to retrieve a used consumable part from the process module and replace with a new consumable part.

In some embodiments, the replacement station may be mounted directly to a process module of a cluster tool assembly in which a consumable part needs to be replaced. In such embodiments, the replacement station is coupled directly to the process module. A robot defined in the replacement station is used to retrieve and replace the consumable part.

In some other embodiments, the replacement station may be mounted directly to a vacuum transfer module (VTM) within a cluster tool assembly. The replacement station is mounted so as to maintain uniformity and symmetry of the cluster tool assembly. A robot of the VTM that is used to move a semiconductor wafer into and out of process modules is also used to retrieve and replace a consumable part disposed in a process module.

In some other embodiments, the replacement station may be mounted directly to an atmospheric transfer module of a cluster tool assembly. In such embodiments, a robot of the atmospheric transfer module works with a robot of a vacuum transfer module of the cluster tool assembly to access and replace the consumable part from a process module. The replacement station is designed to mount to different modules of the cluster tool assembly and enable replacing of the consumable part without requiring the cluster tool assembly to be opened to atmospheric conditions to access the consumable part.

Traditional design of a cluster tool assembly required the cluster tool assembly to be opened in order to access and replace the consumable part within a process module. Opening of the cluster tool assembly required taking the cluster tool assembly offline and purging the cluster tool assembly to atmospheric condition to allow access to the process modules. Once the cluster tool assembly is opened, a trained technician would manually remove and replace the consumable part from a process module. Upon replacement of the consumable part, the cluster tool assembly had to be conditioned so that the semiconductor wafer can be processed. Since the semiconductor wafers are valuable products, extreme care has to be taken when conditioning the cluster tool assembly. The conditioning would require cleaning the cluster tool assembly, pumping the cluster tool assembly to vacuum, conditioning the cluster tool assembly and qualifying the cluster tool assembly using test runs. Each of these steps requires considerable time and effort. In addition to the time required at every step to condition the cluster tool assembly, additional delays may be experienced when problems are encountered at one or more of the steps during the conditioning of the cluster tool assembly. Some of the problems commonly encountered during the conditioning of the cluster tool assembly may include misalignment of the consumable part during replacement, damage to the new consumable part when replacing a damaged or used consumable part, damage to other hardware components in the process module during retrieval or replacement of the consumable part, cluster tool assembly not achieving vacuum after pumping, cluster tool assembly not achieving process performance, etc. Based on the severity of each problem, additional time and effort may have to be expended, further contributing to delay of bringing the cluster tool assembly online, directly impacting the profit margin for a manufacturer.

Mounting a replacement station to the cluster tool assembly and accessing the consumable part through the replacement station saves considerable amount of time and effort required for maintaining the cluster tool assembly. The risk of damage to the consumable part, process module and/or the cluster tool assembly is minimized by using a robot available within the cluster tool assembly for replacing the consumable part, and the risk of contamination is minimized by maintaining the replacement station at vacuum, thereby avoiding exposure of the inside of the cluster tool assembly to outside atmosphere. Using the robot, one can achieve a more precise alignment of the consumable part in the process module while minimizing damage to other hardware components of the process module. Consequently, time required to condition the cluster tool assembly is greatly reduced. Timely replacement of the consumable parts increases quality and yield of semiconductor components defined in the semiconductor wafer.

FIG. 1 illustrates a simplified schematic diagram of a cluster tool assembly 100 that is used to process a semiconductor wafer, in one embodiment. The cluster tool assembly 100 includes a plurality of modules to allow the semiconductor wafer to be processed in a controlled environment with minimal exposure of the semiconductor wafer to environment. The cluster tool assembly 100, in one embodiment, includes an atmospheric transfer module (ATM) 102, a common vacuum transfer module (VTM) 104 and one or more process modules 112-120. The ATM 102 is operated under ambient (i.e., atmospheric) condition and interfaces with a wafer loader (not shown) to bring a semiconductor wafer into the integrated cluster tool assembly 100 for processing, and for returning the semiconductor wafer, after processing. The ATM 102 may include a robot to move the semiconductor wafer from the wafer loader to the VTM 104. The robot may be part of a dry robot as the ATM 102 is at atmospheric condition.

The VTM 104 is operated under vacuum so as to minimize exposure of the semiconductor wafer surface to atmospheric air as the semiconductor wafer is moved from one process module into another. Since, the VTM 104 is operating under vacuum and the ATM 102 is operating at atmospheric condition, a loadlock chamber 110 is placed between the ATM 102 and the VTM 104. The loadlock chamber 110 provides a controlled interface to allow the transfer of the semiconductor wafer from the ATM 102 in to the VTM 104. In this embodiment, the robot within the ATM 102 may be used to deposit the semiconductor wafer into the loadlock chamber 110. A separate robot may be provided within the VTM 104 to retrieve the semiconductor wafer from the loadlock chamber 110 and transfer the semiconductor wafer into and out of process module (112-120). Due to its location, the loadlock chamber, in some embodiments, is also referred to as an "interfacing chamber".

The one or more process modules 112-120 are integrated with the VTM 104 so as to allow the semiconductor wafer to move from one process module to another process module in a controlled environment maintained by the VTM 104. In some embodiments, the process modules 112-120 may be distributed uniformly around the VTM 104 and are used to perform distinct process operations. Some of the process operations that can be carried out using the process modules 112-120 include etch operation, rinsing, cleaning, drying operation, plasma operation, deposition operation, plating operation, etc. By way of example, process module 112 may be used to perform a deposition operation, process module 114 may be used to perform a cleaning operation, process module 116 may be used to perform a second deposition operation, process module 118 may be used to perform an etch or removal operation, and so on. The VTM 104 with the controlled environment allows the semiconductor wafer to be transferred into and out of the process modules 112-120 without risk of contamination and the robot within the VTM 104 assists in transferring the semiconductor wafer into and out of the various process modules 112-120 that are integrated with the VTM 104.

In one embodiment, a replacement station 108 is mounted to a process module (e.g., any one of the process modules 112-120) within the cluster tool assembly 100. In the example embodiment illustrated in FIG. 1, the replacement station 108 is mounted to process module 118. The replacement station may be configured to mount to any of the other process modules 112-120, as and when consumable part(s) needs to be replaced in the respective process modules 112-120. The process module 118, for example, may be used to perform an etch operation. The replacement station 108 is used to retrieve and replace a consumable part that is used in the process module 118. The replacement station 108 includes a mechanism, such as a pump mechanism, (not shown) to pump and maintain the replacement station 108 at vacuum, when mounted to the process module.

In one embodiment, the replacement station 108 may be coupled to the process module (i.e., any one of process modules 112-120) through an isolation valve, when a consumable part needs to be replaced at the process module (112-120) and de-coupled from the process module (112-120) when the consumable part has been successfully replaced. In this embodiment, the replacement station 108 is a moveable modular unit that is designed to be temporarily mounted to a process module to complete the required operation (e.g., replacement of consumable part), dismounted once the required operation at the process module is completed, and either retracted or moved to a different process module where the required operation of replacing the consumable part is performed. For example, the isolation valve allows the replacement station 108 to be maintained at vacuum.

The replacement station 108 includes a part buffer to receive and hold the consumable part. In some embodiments, the part buffer may include a plurality of compartments for receiving the used consumable parts that are retrieved from a process module and new consumable parts that are to be delivered to the process module. In one embodiment, an opening in the replacement station 108, where the replacement station is mounted to the isolation valve, is sized to allow the movement of the consumable part into and out of the replacement station 108.

The consumable part is a hardware part within the process module that needs to be replaced due to its continuous exposure to the process conditions within the process module. As a result of its continuous exposure to the harsh process conditions used during processing of the semiconductor wafer, the consumable part needs to be closely monitored to determine when damage has exceeded an acceptable level so that it can be promptly replaced. For example, in an etch process module, an edge ring is disposed adjacent to the semiconductor wafer mounted on a chuck assembly to extend the process region of the semiconductor wafer. During the etching operation, the edge ring is exposed to the ion bombardment from the plasma that is used to form features on a surface of the semiconductor wafer. Over a course of time, as a result of continuous exposure, the edge ring may get damaged. When the edge ring gets damaged beyond an acceptable level, the edge ring needs to be replaced so that damage of the edge ring does not expose other underlying components or otherwise adversely affect the semiconductor wafer processing.

In a typical etch operation, ions from the plasma hit the semiconductor wafer surface at an angle that is perpendicular to a plasma sheath formed in a process region defined above the semiconductor wafer, when received in the process module. When layers of the edge ring wear away due to ion bombardment, the edge of the semiconductor wafer is exposed causing the plasma sheath to roll along a contour of the semiconductor wafer edge. Consequently, the ions hitting the semiconductor wafer surface follow the contour of the plasma sheath thereby causing tilt features to be formed toward the edge of the semiconductor wafer surface. These tilt features would affect the overall yield of the semiconductor components formed on the semiconductor wafer. Further, as layers of the edge ring wear away, an underlying component, such as a chuck, for example, may get exposed to the ions, damaging the chuck surface. In order to improve the yield and to avoid damage to any underlying components, the edge ring (i.e., consumable part) needs to be replaced periodically.

The replacement station 108 mounted to the process module 118 would allow the consumable part (i.e., edge ring) to be easily replaced without breaking vacuum in the process module. In one embodiment, the replacement station 108 includes a dedicated robot that is configured to extend an end effector into the process module (e.g., process module 118) to retrieve the consumable part that needs to be replaced, and to deliver a new consumable part. A lift mechanism within the process module provides access to the consumable part. The robot of the replacement station 108 may work to place the new consumable part on a lift pin of the lift mechanism, and the lift mechanism would install the new consumable part in its position within the process module.

In one embodiment, to assist in replacing the consumable part, the replacement station is mounted to the process module (e.g., any one or each of the process modules 112-120) through a first isolation valve. A robot from the replacement station is used to access and retrieve a consumable part from the process module and move into a part buffer defined in the replacement station and provide a replacement consumable part from the part buffer. In one embodiment, the first isolation valve may be operatively connected to a controller to coordinate retrieval and replacement of the consumable part in the process module.

In addition to using the first isolation valve to mount the replacement station to the process module, the process module may be coupled to a vacuum transfer module (VTM) of the cluster tool assembly 100 using a second isolation valve. When engaged, the second isolation valve is configured to isolate the process module (112-120) from the rest of the cluster tool assembly 100 so that the replacement of the consumable part within the process module can be easily carried out without affecting operation of other process modules of the cluster tool assembly 100. Providing the second isolation valve allows the specific process module (any one of 112-120) to be taken off-line instead of the whole cluster tool assembly 100, while the remainder of the process modules (112-120) within the cluster tool assembly 100 may be allowed to continue processing the semiconductor wafer. Further, as only a specific process module (e.g., any one of 112-120) is brought off-line for replacing the consumable part(s), it would take considerably less time to restore the process module (112-120) and the cluster tool assembly 100 to a fully operational state. As a result, time taken for conditioning and qualifying operation of the cluster tool assembly 100 is much shorter. A robot of the VTM 104 may be used to move the semiconductor wafer in and out of the process module (112-120) during semiconductor wafer processing.

To allow the robot of the replacement station 108 to retrieve the consumable part from the process module (112-120), the consumable part has to be easily accessible. The process module (112-120), in one embodiment, includes a lift mechanism that provides access to the consumable part that needs to be replaced. The lift mechanism, in some embodiments, may include lift pins that can be extended to move the consumable part to a raised position. An end effector of the robot in the replacement station 108 is extended into the process module (112-120) and slid below the consumable part. The lift mechanism then retracts the lift pin leaving the consumable part to rest on the end effector of the robot. The end effector with the consumable part is then retracted from the process module (112-120) into the replacement station 108. A new consumable part is moved to the process module (112-120) using the end effector of the robot and the lift pins of the lift mechanism is extended to receive the new consumable part. The lift pins of the lift mechanism act together to align the new consumable part into position in the process module (112-120). The process of retrieving and replacing the consumable part using the lift mechanism will be discussed in more detail with reference to FIG. 4.

In some embodiments, the entire cluster tool assembly 100 may have to be brought off-line to replace the consumable part. This may occur when more than one consumable part within more than one process module (112-120) needs to be replaced, for example. Even in such embodiments, the time to bring the cluster tool assembly 100 off-line, mount the replacement station to the process module(s) (112-120), remove and replace the consumable part, condition and qualify the cluster tool assembly 100 may be much shorter as the replacement station and the process module(s) are maintained at vacuum. As a result, the process condition (i.e., vacuum) of the cluster tool assembly 100 is not adversely affected during replacement of the consumable part. Further, as the replacement is done using robot, more precise retrieval and placement of the consumable part may be engineered, thereby avoiding risk of damage to the consumable part and/or process module (112-120).

In some implementations, an opening at a side of the process module where the replacement station is mounted may be sized so that the consumable part can easily fit through the opening. Further, the opening in the process module (112-120) may be designed to minimize any asymmetry issues that may occur in the process module (112-120) and in the cluster tool assembly 100 as a whole.

The various embodiments and implementations discussed with reference to FIG. 1 allow the replacement station 108 to be mounted temporarily to the process module (112-120) when a consumable part in the process module (112-120) needs to be replaced, and retracted when the replacement of the consumable part is completed. The replacement station 108 may include a single part buffer with two distinct holding areas to receive and hold the used and new consumable parts or alternately have different part buffers for holding the used and new consumable parts separately. The robot provided in the replacement station 108 and the part buffer(s) allow delivery and retrieval of the consumable part directly to and from the process module (112-120). The isolation valves in the process module (112-120) allow bringing just the process module (112-120) offline instead of the entire cluster tool assembly 100.

Figure 2:
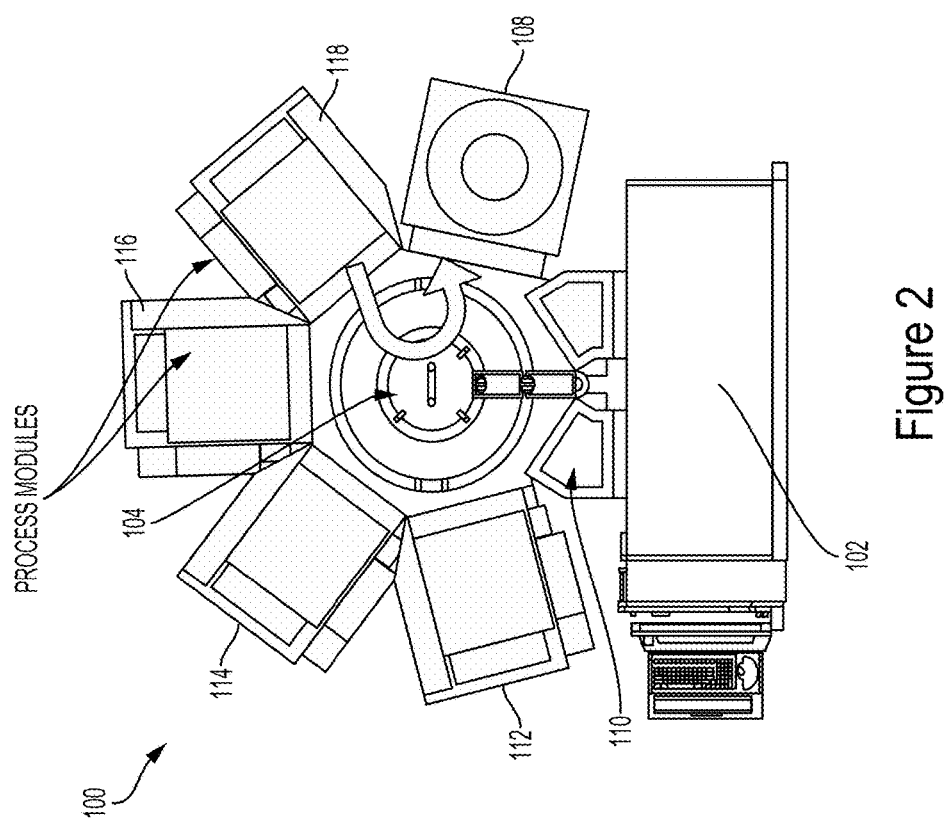
FIG. 2 illustrates a simplified block diagram of a cluster tool assembly that includes a replacement station mounted to a vacuum transfer module of the cluster tool, in an alternate embodiment of the invention.

FIG. 2 illustrates an alternate embodiment of a cluster tool assembly 100 wherein the replacement station 108 is configured to be mounted to a vacuum transfer module (VTM) 104 disposed in the cluster tool assembly 100 instead of the process module (112-118). The VTM 104 includes a robot that is used, during processing of the semiconductor wafer, to move a semiconductor wafer from a loadlock chamber 110 to a process module 112-118, and into and out of one or more process modules 112-118 integrated with the VTM 104. The robot includes an end effector that is used to receive, hold and move the semiconductor wafer between the different process modules. A separate opening is defined in the VTM 104 to allow the replacement station 108 to be mounted such that the replacement station 108 aligns with the opening defined in the VTM 104. Where symmetry is important, the opening in the VTM 104 is defined to preserve the uniformity and symmetry of the VTM 104, and of the cluster tool assembly 100. For example, a dummy opening with a dummy door may be defined in the VTM 104 opposite to the opening, to maintain the uniformity and symmetry at the VTM 104. Alternately, if a dummy opening is already present in the VTM 104 and the opening is large enough to move the consumable part, the replacement station 108 may be mounted to the dummy opening so as to continue to maintain the uniformity and symmetry in the cluster tool assembly 100.

Typically, the opening in the VTM 104 is sized to fit the semiconductor wafer and a carrier/robot that are used to move the semiconductor wafer in to and out of the VTM 104. However, a consumable part that is larger than the semiconductor wafer may not fit through. For example, an edge ring disposed to surround the semiconductor wafer when received in the process module (112-118), is wider than the semiconductor wafer. In such cases, the edge ring as a whole may not be able to fit through the opening that was designed to move the semiconductor wafer, without re-engineering the opening. In some cases, re-engineering the opening of the VTM 104 may not be a viable option as it may affect symmetry of the cluster tool assembly. Therefore, instead of re-engineering the opening of the VTM 104 and causing asymmetry in the cluster tool assembly 100, a segmented consumable part may be used so that each segment may fit through the opening. For example, the edge ring that is used to surround the semiconductor wafer in the process module may be designed as a segmented edge ring made up of two or more parts with each part designed to fit through the opening of the VTM 104 and the replacement station 108. In this example, the segmented edge ring may be individually extracted and replaced.

When replacing the consumable part, especially a multi-part segmented consumable part, each segment of the consumable part has to be properly aligned and set within the process module so that no gap is defined between the segments. It should be noted that in process operations, such as a high-aspect ratio etching operation, a gap present between any components of a etch process module would cause the ion to flow through and damage any underlying component. For example, a gap in an edge ring in a high aspect etcher module would cause the high-energy ion to flow through to an underlying chuck on which the edge ring may be disposed, damaging the surface of the chuck. To prevent the gap from forming, the segmented consumable part may be designed to ensure that each segment fits tightly with other segment when installed in the process module. Accordingly, in some implementations, the segmented or multi-part consumable part may be designed to have interlocking segments. Alternately, the consumable part may be designed to have overlapping segments so as to prevent the ion or processing gas/chemistry from finding a direct flow path to the underlying component. For example, in some implementations, the consumable part may be made of an inner part and an outer part that can either wholly or segmentally fit through the opening defined between the VTM 104 and the replacement station, and installed in the process module with one part overlapping over the other part, thereby preventing gap from forming. Other variations in design of the consumable part may be implemented to enable the consumable part to be moved into and out of the VTM 104 without having to re-engineer the opening that is designed to maintain symmetry in the cluster tool assembly.

In one embodiment, instead of using a dedicated robot in the replacement station 108, a robot used in the VTM 104 to move the semiconductor wafer into and out of the process module, may also be used in the retrieval and replacement of the consumable part. In some implementations, an end effector of the robot that is used to move the semiconductor wafer between the process modules is also used to receive, hold and move the consumable part between the process module 112-118 and the replacement station 108. In other implementations, the robot of the VTM 104 is designed to have different end effectors for moving the consumable part and the semiconductor wafer. An end effector is a part that is usually defined in a robot for retrieving, supporting, holding, picking, lifting, moving, or rotating a moveable part, such as a semiconductor wafer or a consumable part. The moveable part may be held in any orientation plane. Separate end effectors may be provided to separately move the consumable part and the semiconductor wafer so as to prevent contamination of the semiconductor wafer.

In an alternate embodiment, a dedicated robot in the replacement station 108 may work with the robot of the VTM 104 to extract and replace the consumable part in a process module. For example, the robot of the VTM 104 may be used to extract the used consumable part from the process module and move it to a staging area defined between the VTM 104 and the replacement station 108. The dedicated robot of the replacement station 108 may be used to move the used consumable part from the staging area into a part buffer. Similarly, the dedicated robot of the replacement station 108 may be used to move a new consumable part from the part buffer of the replacement station 108 into the staging area and the robot of the VTM 104 may be used to move the new consumable part from the staging area to the process module. In one embodiment, the staging area may have a first area for receiving the used consumable part and a second area for receiving the new consumable part. The lift mechanism in the process module (112-118) is used to install the new consumable part in the process module (112-118).

The design of the replacement station 108 in the embodiment illustrated in FIG. 2 is similar to the design of the replacement station 108 discussed with reference to FIG. 1. For example, the replacement station 108 of FIG. 2 includes a mechanism, such as a pump, to maintain the replacement station 108 at vacuum when the replacement station 108 is mounted to the VTM 104. Maintaining the process condition of the replacement station 108 similar to the VTM 104 (i.e., at vacuum) would ensure that the process condition within the VTM 104 is not adversely affected during replacement of the consumable part. One or more part buffers are defined in the replacement station 108 to receive and hold the used and new consumable parts.

The design of the process module (118) illustrated in FIG. 2 is slightly different from the process module (118) defined in FIG. 1. In that, the process module illustrated in FIG. 2 does not include a second opening. For example, as the replacement station 108 is being mounted directly to the VTM 104 and access to the process module (118) from the replacement station 108 is provided through the VTM 104, the process module (118) does not require a second opening for mounting the replacement station 108. Additionally, a single isolation valve is used to provide access to the process module (118) through the VTM 104 during replacement of the consumable part and for isolating the process module during processing of semiconductor wafer. It should be noted that the replacement station 108 is maintained at vacuum so that the consumable part may be easily replaced without adversely affecting the process condition in the cluster tool assembly 100. Consequently, the conditioning and qualifying of the cluster tool assembly 100 to process the semiconductor wafer may be accomplished in a shorter time as the purge/pump process is not required and the other qualifying steps are performed in a shorter time. The replacement station 108, in some implementations, may be permanently mounted to the VTM 104.

Figure 3:
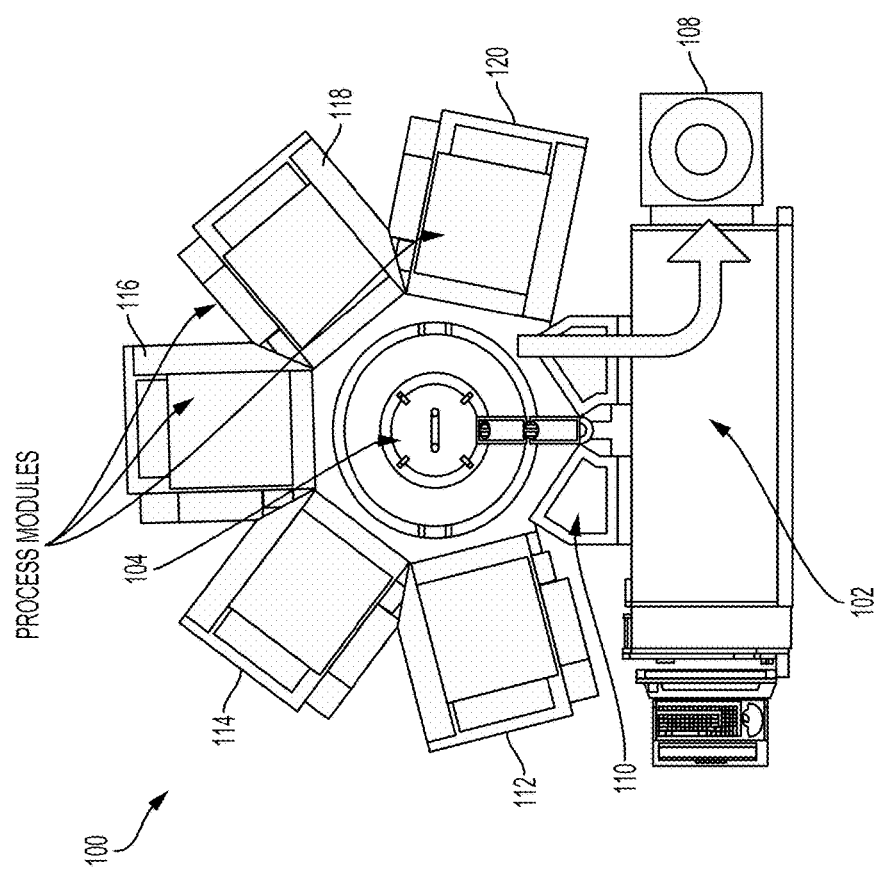
FIG. 3 illustrates a simplified block diagram of a cluster tool assembly that includes a replacement station mounted to an atmospheric transfer module of the cluster tool, in an alternate embodiment of the invention.

FIG. 3 illustrates another embodiment of a cluster tool assembly 100 wherein the replacement station 108 is mounted to an atmospheric transfer module (ATM) 102. A robot in the ATM 102 of the cluster tool assembly 100 used to move the semiconductor wafer from a wafer loader, for example, to a loadlock chamber 110 is also used to move the consumable part to and from the replacement station 108. In this embodiment, the replacement station 108 mounted to the ATM 102 is maintained at same atmospheric condition as the ATM 102. Consequently, the replacement station 108 does not need a pump or similar mechanism to maintain the replacement station 108 at vacuum. In some implementations, the replacement station 108 may be permanently mounted to the ATM 102.

In addition to the ATM 102, the cluster tool assembly 100 illustrated in FIG. 3 includes a vacuum transfer module (VTM) 104 and a plurality of process modules 112-120 integrated with the VTM 104. A loadlock chamber 110 is defined between the ATM 102 and the VTM 104 and acts as an interface to move the semiconductor wafer from ATM 102 to the VTM 104, while preserving process conditions in the ATM 102 and VTM 104.

The loadlock chamber 110 of the cluster tool assembly 100 is designed to handle both the semiconductor wafer and the consumable part. Separate staging areas, such as compartments, may be provided in the loadlock chamber 110 for receiving the semiconductor wafer and the consumable part in order to avoid contaminating the semiconductor wafer. The staging area in the loadlock chamber 110 designed for receiving the consumable part may be further configured to provide separating staging areas for receiving the used consumable part and the new consumable part. An opening defined in the loadlock chamber 110 is designed to fit the consumable part and the semiconductor wafer. Alternately, when the opening is not designed to fit the consumable part, a segmented consumable part may be used so that each segment of the consumable part may fit through the opening defined in the loadlock chamber 110.

In the embodiment illustrated in FIG. 3, a robot in the VTM 104 used to move the semiconductor wafer from the loadlock chamber 110 to a process module (112-120) that is integrated into the VTM 104 or from one process module (112-120) to another, is also used to move the consumable part between the loadlock chamber 110 and the process module (112-120).

In some implementations, in addition to the robot s of the ATM 102 and the VTM 104, the replacement station 108, may include a dedicated robot that is configured to move the consumable part between a part buffer of the replacement station and the ATM 102. In such embodiments, the robot of the ATM 102 may be used to move the consumable part and the semiconductor wafer between the ATM 102 and the loadlock chamber 110, and the robot of the VTM 104 may be used to move the consumable part and the semiconductor wafer between the loadlock chamber 110 and the process module (112-120). In one implementation, a single end effector may be provided in the robots of the ATM 102 and VTM 104 that may be engaged at different times to move both the semiconductor wafer and the consumable part. In another embodiment, separate end effectors may be provided in the robots of the ATM 102 and the VTM 104, one for moving the semiconductor wafer and another for moving the consumable part. A lift mechanism is used to properly align and install the new consumable part at appropriate location within the process module (112-120).

Figure 3A:
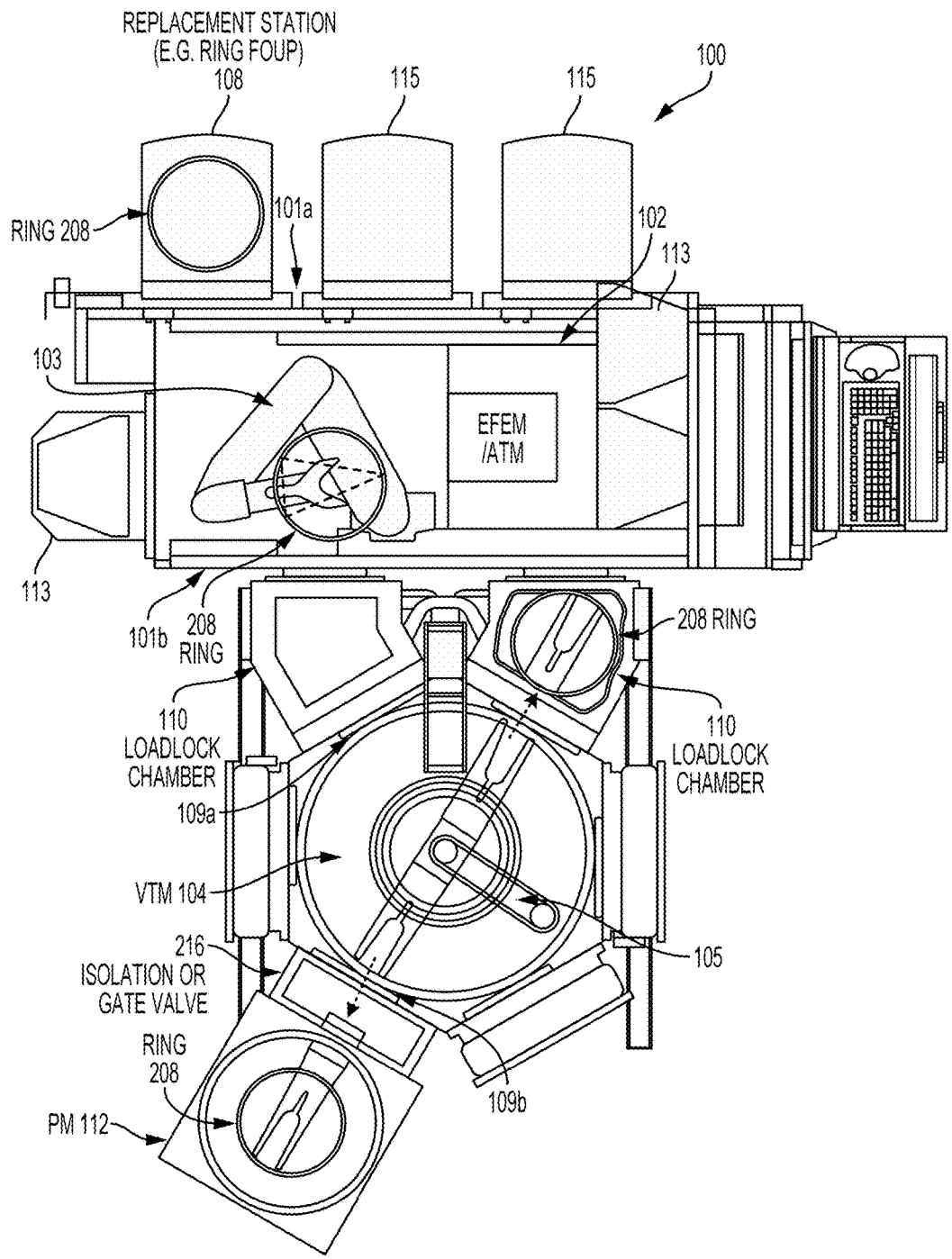
FIG. 3A illustrates a simplified block diagram of a cluster tool assembly that includes robots with end effectors that are used to move the consumable part within the cluster tool, in one embodiment of the invention.

FIG. 3A illustrates a more detailed version of a cluster tool assembly 100 that includes an additional module than what is illustrated in FIG. 3, in one embodiment. As in FIG. 3, the embodiment illustrated in FIG. 3A shows a replacement station 108 coupled to a first side 101*a* of an ATM 102 and use robots of the ATM 102 and a VTM 104 for replacing the consumable part. In this embodiment, in addition to the replacement station 108 being mounted at a first side 101*a* of the ATM 102, one or more wafer loaders 115 are mounted at the first side 101*a* of the atmospheric transfer module 102. The wafer loader 115 may be a standard wafer loader, such as a front opening unified pod (FOUP) or a customized wafer loader that is designed to be coupled to the ATM 102. The replacement station 108 and the wafer loader(s) 115 are configured to be temporarily or permanently coupled to the ATM 102 via specific load ports (not shown) defined at the first side 101*a* of the ATM 102. The door to the replacement station 108 and the wafer loader(s) 115 (both standard and customized wafer loaders) are designed to be compatible with an opening of a standard load port defined on the first side 101*a* of the ATM 102. The wafer loader 115 includes a wafer buffer that includes a plurality of compartments for receiving and holding processed or un-processed wafers. It should be noted that wafers and substrates are used interchangeably in this application and refer to a thin slice of semiconductor material used for fabrication of electronic devices, such as integrated circuits. In some embodiments, the replacement station 108 is similar in structure and design to the wafer loader 115 (e.g., FOUP), and includes a part buffer 224 with a plurality of compartments 207 that are configured to receive and store the new and/or used consumable parts 208.

In addition to the replacement station 108 and the wafer loaders 115, one or more buffer stations 113 may be coupled to the ATM 102. The buffer stations 113 may include dynamic aligners that are generally used to provide alignment inputs to a computer that is communicatively connected to the ATM 102. The alignment input is used to align the wafer when it is being delivered to the loadlock chamber 110. For example, a robot 103 within the ATM 102 may be used to move the wafer from one of the wafer loaders 115 on to a chuck disposed inside a dynamic aligner within the buffer station 113. The chuck is configured to spin the wafer. A sensor within the dynamic aligner is used to detect one or more notches provided along an edge of the wafer, the off-center of the notch, and provide this data as alignment input to the computer. The computer may provide the alignment input to the robot, so that the robot can use the alignment input to deliver the wafer from the dynamic aligner to the loadlock chamber 110, such that the wafer is properly aligned when delivered. In some implementations, one or more of the dynamic aligners may be used to provide alignment input for the consumable part to the computer to ensure the consumable part is properly aligned when delivered to the loadlock chamber 110. It should be noted that the alignment input for aligning the wafer may be different from the alignment input for aligning the consumable part. In other implementations, the alignment of the consumable part may be done within the replacement station. In such implementations, there is no need to perform further alignment when delivering the consumable part to the loadlock chamber 110.

In some embodiments, the robot 103 within the ATM 102 that is designed to move the wafer is also designed to move a consumable part 208 from the replacement station 108 to the loadlock chamber 110. The existing design of the robot 103 includes an end effector mechanism with "fingers" that are used to support the wafer. However, the fingers on the end effector mechanism are designed to support the wafer, and are therefore short and not designed to provide the contact support for the consumable part, as the consumable part is typically larger in diameter than the wafer. To accommodate for this discrepancy, in one embodiment, the fingers of the end effector mechanism of the robot 103 within the ATM 102 are extended to a length that is sufficient to allow the fingers to provide contact support for the consumable part 208. Although the end effector mechanism with extended fingers has been described as being implemented in the robot 103 of the ATM 102, it should be noted that the end effector mechanism described herein may also be implemented in a robot 105 of the VTM 104.

In an alternate embodiment, the short fingers of the end effector mechanism of the robot within the ATM 102 are used to support a ring carrier. The surface of the ring carrier is used to support the consumable part. The ring carrier may be in the form of a carrier plate that is stored within a housing in the replacement station 108 and retrieved when the consumable part needs to be transported to the loadlock chamber 110. In this embodiment, the fingers of the end-effector need not have to be re-designed as the existing fingers of the end effector can be used to support the carrier plate. Details of the end effector mechanism used within the ATM 102 and/or the VTM 104 will be described in detail with reference to FIGS. 6A-6C. The carrier plate used in supporting and transporting the consumable part will be described with reference to FIGS. 8A-8B, 9A-9B.

Replacing a consumable part in a process module 112 integrated in a cluster tool assembly 100 requires access to the process module 112 and to the consumable part 208 within the process module 112. The access to the process module 112 has been discussed with reference to FIGS. 1-3 wherein a replacement station 108 is mounted directly to a process module (112-120), or to a vacuum transfer module 104 or to an atmospheric transfer module 102 through which access is provided to the process module (112-118, 120). Once the process module (112-120) is accessed, access to the consumable part needs to be provided so that the consumable part can be safely retrieved and replaced without damaging the consumable part or other hardware components of the process module (112-120).

Figure 4:
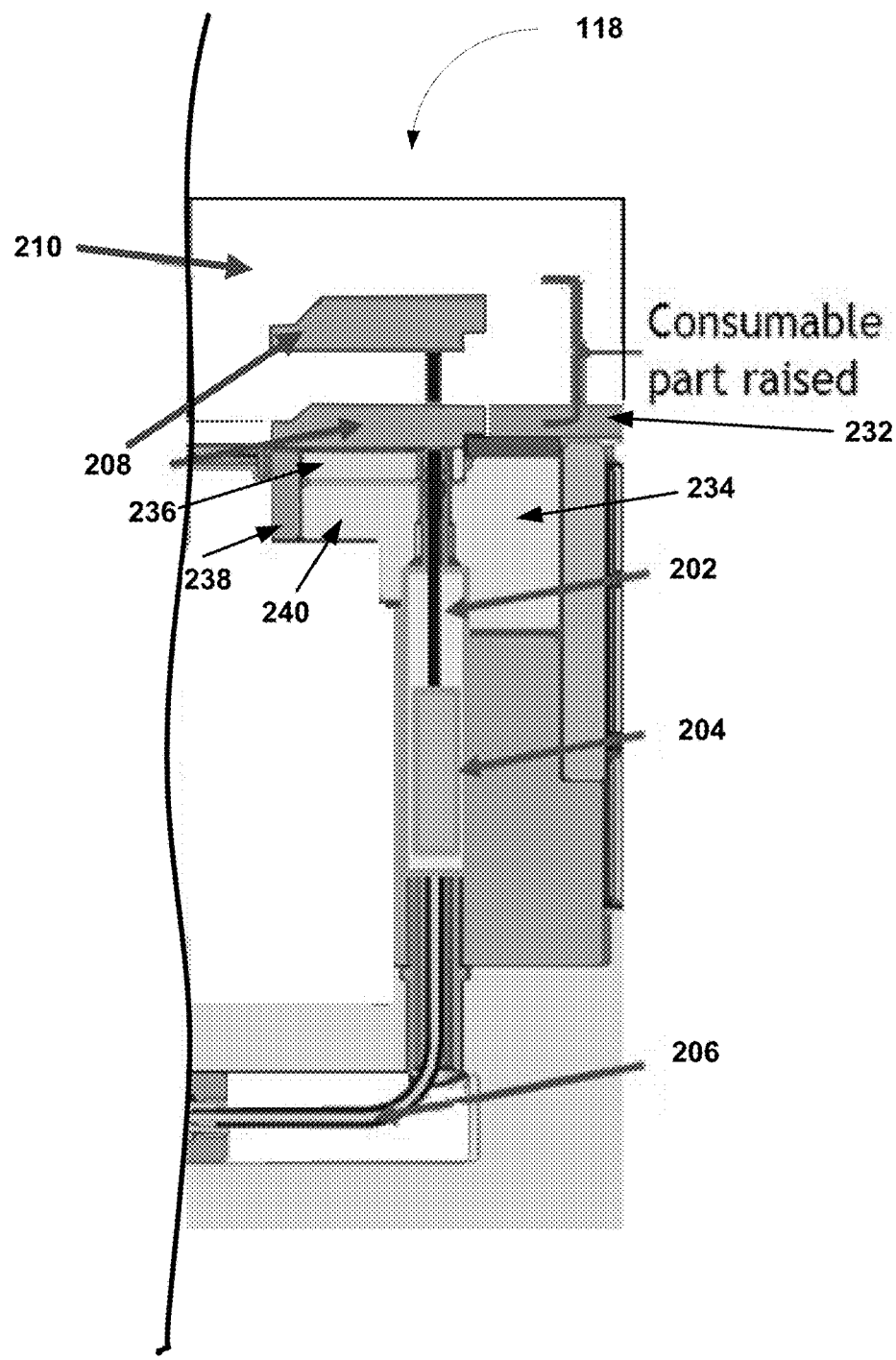
FIG. 4 illustrates a simplified block diagram of a portion of a process module of a cluster tool assembly that includes an example lift mechanism used to provide access to a consumable part, in one embodiment of the invention.

FIG. 4 illustrates an example embodiment of a lift mechanism that may be used within a process module (112-120) of a cluster tool assembly 100 to provide access to a consumable part 208 that needs to be replaced. In some implementations, the consumable part 208 is disposed over a bottom edge ring 236, and adjacent to a cover ring 232. The bottom edge ring 236 is disposed over a base ring 240 and, in some implementations, next to a sleeve ring 238. An insulator ring 234 may be provided between the lift mechanism and a sidewall of the chamber. The lift mechanism is configured to move the consumable part 208 to a raised position so that the consumable part 208 can be accessed. In some implementation, the consumable part 208 is an edge ring that is disposed adjacent to a semiconductor wafer 150 that is received in the process module during processing. The lift mechanism includes a plurality of lift pins 202 that are connected to a plurality of actuators 204. For example, the lift pins may be distributed along a plane to allow the lift pins to contact the consumable part at different points and move the consumable part. In some implementations, the lift pins distributed in a plane may be grouped into distinct sets, with each set of lift pins being operated independently to access and lift different consumable parts. In some implementations, the actuators 204 are vacuum-sealed actuators 204 that are outfitted with plurality of lift pins 202.

The actuators 204 are driven by an actuator drive 206. In a disengaged mode, the lift pins 202 stay retracted inside a housing defined in the lift mechanism and is not in contact with the consumable part 208. When the consumable part 208 needs to be replaced, the actuator 204 is powered through the actuator drive 206. The powered actuator 204 causes the lift pins 202 to extend outside of the housing so as to come in contact with the consumable part 208 and move the consumable part 208 to a raised position. As the process module (e.g., 118) is maintained in a vacuum state, when the consumable part is raised, the consumable part is raised into the vacuum space 210. A robot of either the VTM 104 or the replacement station 108 extends an end effector into the process module 118 and allows it to slide underneath the raised consumable part 208. In some embodiments, the end effector attached to the robot is shaped like a spatula allowing the end effector to support the raised consumable part. Once the end effector has slid into place, the actuators 204 retract the lift pins 202 into the housing, causing the consumable part 208 to rest on the end effector. The robot is then manipulated to pull the end effector back into either the VTM 104 or the replacement station 108, depending on which robot is used to retrieve the consumable part 208, bringing the consumable part 208 with it. A reverse order occurs when a new consumable part 208 needs to be placed in the process module (e.g., 118). The lift mechanism of the process module (e.g., 118) is used to properly install the consumable part in an appropriate location in the process module (118) so that the process module (118) and the cluster tool assembly 100 is operational.

In addition to providing power to the actuators to operate the lift pins to raise the consumable part 208, a power source connected to the actuator drive 206 of the lift mechanism, in some implementations, may supply power to the consumable part through the lift pins. The actuators 204 and the lift pins 202, in such implementations, may be made of conductive material so as to supply power to the consumable part 208. In some implementations, a surface area of the lift pin that comes in contact with the consumable part may act as an electrical contact and be used to supply the power to the consumable part from a power source. In some implementations, the power source is a radio frequency (RF) power source so as to allow the lift pins 202 to supply RF power to the consumable part 208. Additional details of powering the consumable part using RF power source are described in co-owned and co-pending U.S. Provisional Patent Application No. 62/191,817, filed on Jul. 13, 2015, and entitled "Extreme Edge Sheath and Wafer Profile Tuning Through Edge-Localized Ion Trajectory Control and Plasma Operation," which is incorporated herein by reference in its entirety. In some implementations, the lift pins 202 may be switched. The switch may be used to control amount of power supplied to the consumable part 208. In some implementations, the switch may be used to supply different power to the consumable part 208. In some implementations, the power supplied to the consumable part 208 may be used to heat the consumable part 208. For example, when the consumable part 208 is an edge ring, the power supplied by the power source may be used to provide a temperature controlled edge ring. In some implementations, power may be provided to the consumable part 208 through other means, such as through capacitive coupling. Additional details for providing power to the consumable part 208, such as edge ring, using alternate means, such as capacitive coupling are described in co-owned and co-pending U.S. Provisional Patent Application No. 62/206,753, filed on Aug. 18, 2015, and entitled "Edge Ring Assembly for Improving Feature Profile Tilting at Extreme Edge of Wafer," which is incorporated herein by reference. It should be noted that the different means for providing power to a consumable part 208 discussed herein are mere examples and other forms of providing power to the edge ring may also be employed. In some implementations, the consumable part 208 (single piece or different pieces of a multi-piece consumable part) may be aligned and installed into position in the process module (e.g., 118) using one or more magnets. For example, the lift mechanism provided in the process module (e.g., 118) may include a surface on which the consumable part 208 is supported. One or more magnets may be disposed on an underside of the surface of the lift mechanism on which the consumable part 208 is supported. The magnets disposed in the lift mechanism may be used to align the consumable part into position within the process module (e.g., 118).

In some implementations, the lift mechanism may be connected to an air compressor or other compressed pressure source to allow the lift mechanism to be operated pneumatically. In some implementations, the lift mechanism may be used to provide electrostatic clamping to clamp the consumable part 208 in position within the process module (e.g., 118). In these implementations, the lift mechanism may be connected to a direct current (DC) power source to allow the lift pins 202 to provide the DC power to clamp the consumable part 208 in position within the process module (e.g., 118).

Figure 5A:
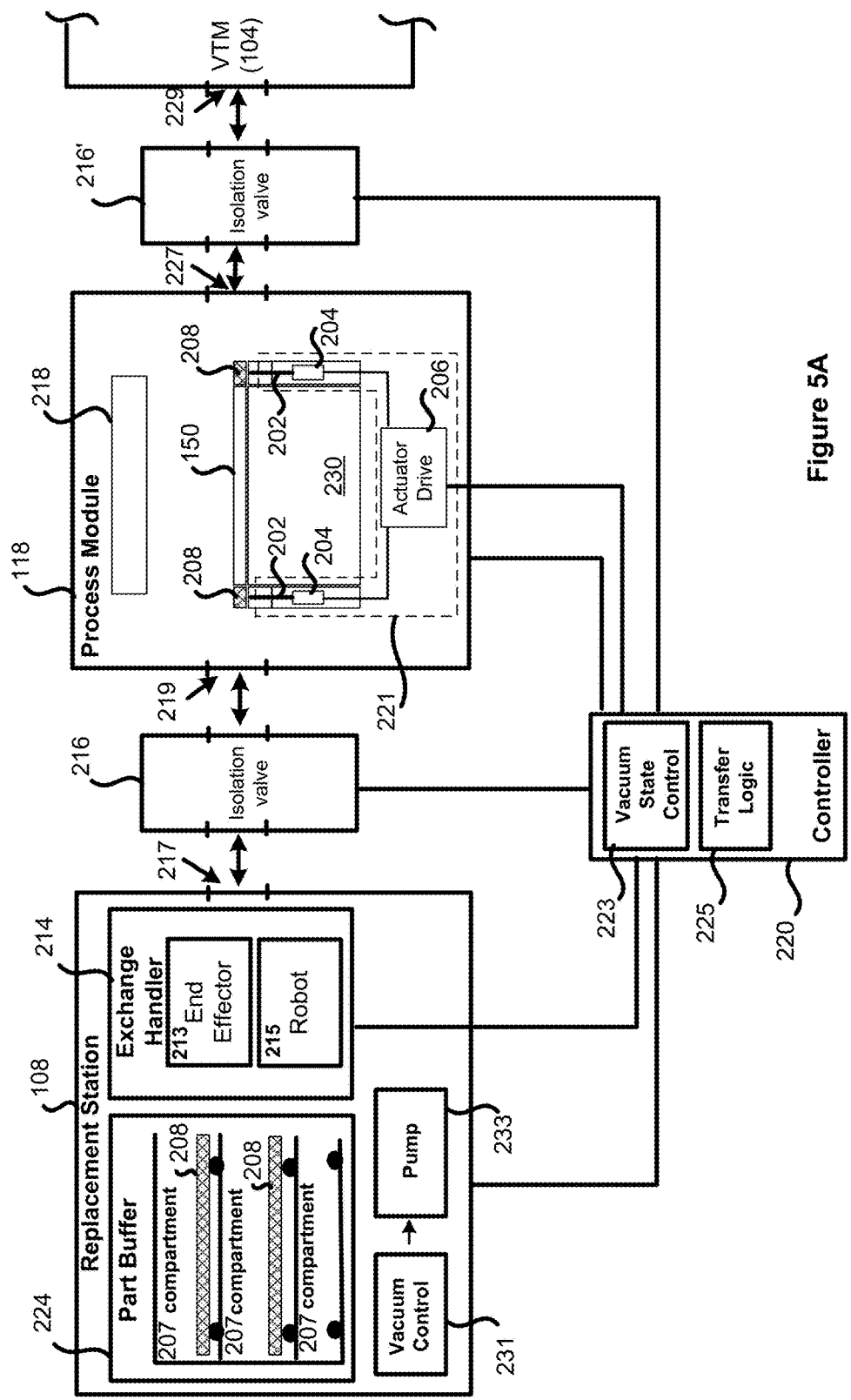
FIG. 5A illustrates a simplified block diagram of a process module with a replacement station mounted for moving a consumable part, wherein a lift mechanism is in a disengaged mode, in one embodiment of the invention.

FIG. 5A illustrates an example cluster tool assembly identifying various components that are used for replacing a consumable part within a process module 118, in one embodiment. The process module 118 may be an etcher module that can be used to generate a transformer coupled plasma (TCP) for performing conductive etching, or a capacitively coupled plasma (CCP) for conducting dielectric etching, or used to perform a plasma enhanced chemical vapor deposition (PECVD) or an atomic layer deposition (ALD), or any other type of etching on a semiconductor wafer. Alternately, the process module 118 may be used to perform any other process operation (e.g., deposition, plating, etc.) to define different features on the semiconductor wafer.

The replacement station 108 may include a part buffer 224. The part buffer 224, in one embodiment, includes a plurality of compartments 207 that are configured to receive used consumable part 208 retrieved from a process module and new consumable part 208 that need to be delivered to the process module. Alternately, separate part buffers 224 may be used to distinctly store used consumable parts 208 and new consumable parts 208. An exchange handler 214 within the replacement station 108 may be used to move the new consumable part 208 from a compartment 207 of the part buffer 224 into the process module 118 and retrieve used consumable part 208 from the process module 118 and store in compartment 207 of the part buffer 224. The exchange handler 214 includes a robot 215 that is configured to move laterally, vertically and/or radially to allow an end effector 213 of the exchange handler 214 to access the consumable part 208 in the part buffer 224 and the process module 118. The end effector may be configured to access, retrieve and deliver the consumable part 208 to the part buffer 224 or the process module. In some implementations, the end effector may be a special end effector that is designed to retrieve, pick, lift, support, hold, move, or rotate the consumable part in any plane. The end effector of the exchange handler 214 may be manipulated to extend and contract during operation so that the consumable part may be retrieved from a process module and stored in the part buffer 224. In some implementations, the end effector may be configured to move radially, laterally and/or vertically to provide greater flexibility during retrieval operation. The exchange handler 214 is connected to a controller 220 to control movement of the robot 215 and the end effector 213 of the exchange handler 214.

The replacement station 108 may also include a vacuum control module 231 that is connected to a pump 233 so as to manipulate the process condition in the replacement station 108. In some implementations, the replacement station 108 is connected to the controller 220 to enable coordinating operation or action of the pump 233 through the vacuum control module 231 during replacement of the consumable part.

A first isolation valve 216 is provided between the replacement station 108 and the process module 118 to allow the replacement station 108 to be mounted to the process module 118. In some implementation, the first isolation valve 216 may be a gate valve. The process module 118 includes a first side and a second side, with the first side of the process module 118 coupled to a vacuum transfer module (VTM) 104, and a second side of the process module 118 coupled to a first side of the first isolation valve 216. A second side of the first isolation valve 216 is coupled to a replacement station 108. The coupling manipulates the doors 217, 219, for example, defined in the replacement station 108 and the process module 118, respectively, so as to allow a robot 215 in the replacement station 108 to access the process module 118. A first side of a second isolation valve 216' is coupled to the VTM 104 and a second side of the second isolation valve 216' is coupled to the first side of the process module 118. The coupling allows manipulation of the doors 227, 229 that cover corresponding openings defined in the process module 118 and the VTM 104, respectively, so as to allow a robot in the VTM 104 to access the process module 118 and move the semiconductor wafer into and out of the process module 118, during processing. The first isolation valve 216 and the second isolation valve 216' are connected to the controller 220 to coordinate coupling of the process module 118 to the VTM 104 and the replacement station 108.

The process module 118 includes an upper electrode 218 that may be used to provide process chemistry to a process region defined in the process module 118. The upper electrode 218 may be connected to a power source (not shown) to provide power to the process chemistry in the process region so as to generate plasma, for example. In some embodiments, the power source may be a RF power source that is connected to the upper electrode 218 through a match network (not shown). Alternately, the upper electrode may be electrically grounded.

The process module 118 also includes a lower electrode 230. The lower electrode 230 is, in some implementations, configured to receive a semiconductor wafer 150 for processing. In some implementations, the lower electrode 230 is an electrostatic chuck. The lower electrode 230 may be coupled to a power source (not shown) to provide power to the lower electrode 230 during processing. Alternately, the lower electrode 230 may be electrically grounded.

The process module 118 includes a lift mechanism 221 to enable the consumable part 208 to be moved to a raised position. The lift mechanism 221 is similar to the lift mechanism discussed with reference to FIG. 4 and includes a plurality of lift pins 202 and actuators 204 to lift the consumable part to a raised position, and an actuator drive 206 connected to the actuators 204 to provide the power to drive the actuator 204. The actuator 206 may be coupled to the controller 220 to control operation of the lift mechanism 221 during replacement of the consumable part.

The controller 220 includes a vacuum state control 223 and a transfer logic 225 to facilitate coordinating operation of the various components that are connected to the controller 220. In one implementation, when a consumable part is to be replaced in the process module 118, the replacement station 108 is brought in contact with the first isolation valve 216. In response to detecting the replacement station 108 at the first isolation valve 216, a signal is sent from the isolation valve 216 to the controller 220. The controller 220 then coordinates the coupling of the replacement station 108 to the process module 118 and maintaining vacuum at the replacement station 108. For example, in response to the detection signal received from the first isolation valve 216, the vacuum state control 223 of the controller 220 may send a signal to the vacuum control 231 to begin the process of coupling the replacement station 108 to the process module 118. In response to the signal received from the vacuum state control 223, the vacuum control 231 may activate the pump 233 to allow the pump 233 to bring the replacement station to a vacuum state. Once the replacement station 108 has reached a vacuum state, a signal is sent from the vacuum control 231 to the vacuum state control 223. The vacuum state control 223 then sends a signal to the first isolation valve 216 to couple the replacement station to the process module 118. The first isolation valve 216, in response, ensures any intermediate region of the first isolation valve 216 between the replacement station 108 and the process module 118 is maintained in a vacuum state. Upon ensuring, the first isolation valve 216 performs the coupling of the process module 118 to a first side of the first isolation valve 216 and the replacement station 108 to a second side of the first isolation valve 216. Further testing may be done to ensure the replacement station 108 and intermediate areas of the first isolation valve 216 are at vacuum before manipulating the doors 217, 219 to provide access to the process module 118.

As part of the coupling operation, the vacuum state control 223 may coordinate operation of a second isolation valve 216' so as to keep the doors 227, 229 covering corresponding openings defined in the process module 118 and the VTM 104 to which the process module 118 is integrated, closed and sealed. During the coupling, the lift mechanism 221 in the process module 118 is kept in a disengaged mode with the lift pins 202 retracted into a housing of the lift mechanism 221 and the consumable part 208 resting in its installed position. For example, the consumable part 208 is an edge ring. In its installed position, the edge ring is positioned adjacent to and substantially surrounding a semiconductor wafer 150, when the semiconductor wafer 150 is present in the process module 118.

Once the process of coupling is completed, a signal is sent from the first isolation valve 216 and, in some embodiments, from the second isolation valve 216', to the controller 220. In response, the controller 220 activates a transfer logic 225.

The transfer logic 225 is configured to coordinate movement of the robot 215, the end effector 213 of the exchange handler 214 within the replacement station 108 and the actuator drive 206 of the lift mechanism 221 in the process module 118 to allow the end effector 213 to retrieve the consumable part from the process module 118 and move to a compartment 207 in a part buffer 224 defined in the replacement station 108 and to move a replacement for the consumable part from a compartment 207 of the part buffer 224 back to the process module 118 for installation. The lift mechanism 221 is manipulated to install the replacement consumable part into an appropriate location in the process module 118.

Figure 5B:
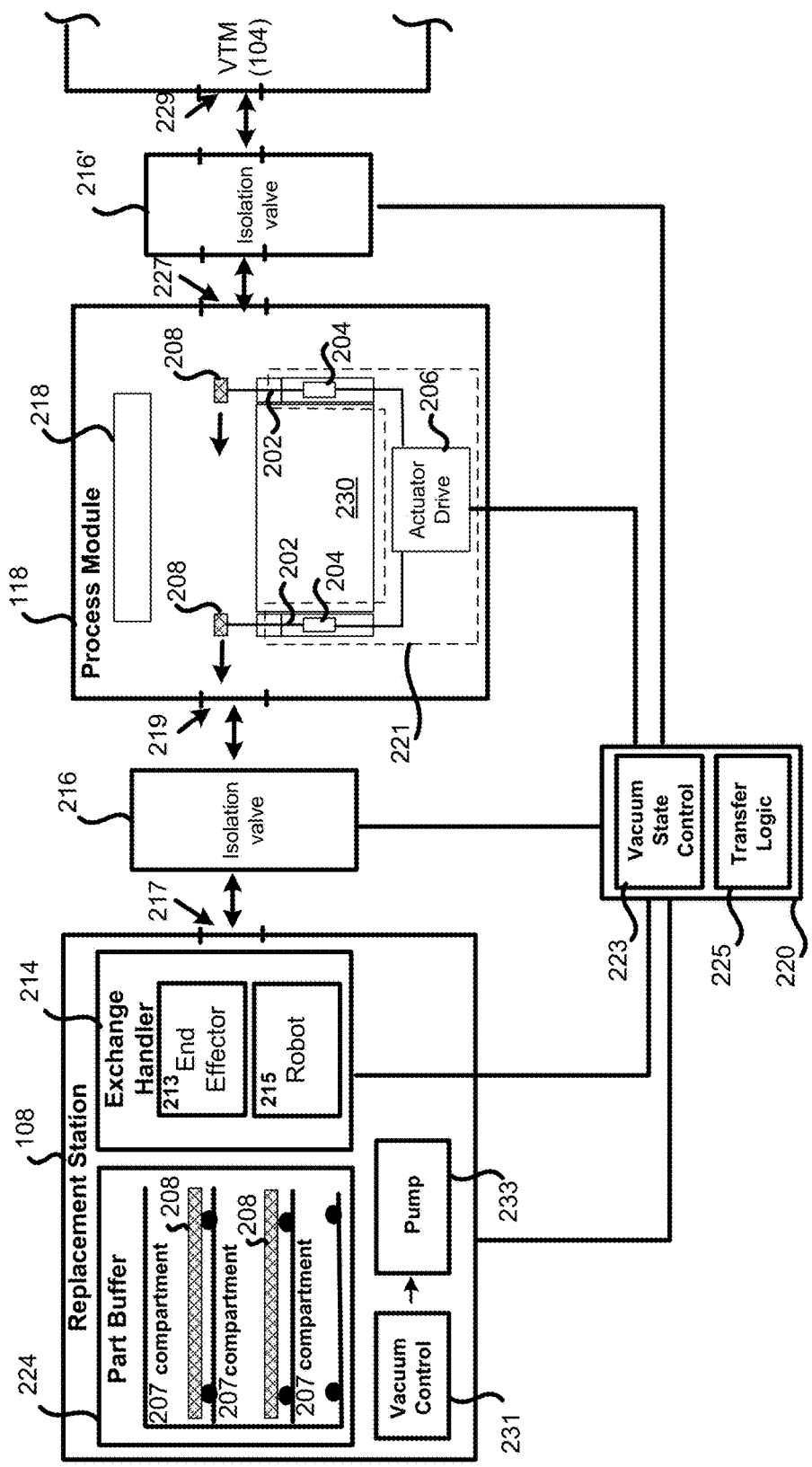
FIG. 5B illustrates a simplified block diagram of a process module with a replacement station mounted, wherein a lift mechanism is in an engaged mode, in one embodiment of the invention.

FIG. 5B illustrates the process followed to retrieve the consumable part 208 from the process module 118, in one embodiment. The consumable part 208 is usually replaced before a semiconductor wafer is received in the process module 118 for processing. In accordance to this embodiment, once the replacement station 108 is coupled to the process module 118 through the first isolation valve 216 and the second isolation valve 216' seals the doors 227, 229 to VTM 104, the transfer logic 225 of the controller 220 is used to send signals to the exchange handler 214 and to the actuator drive 206 to retrieve the consumable part from the process module and replace with a new consumable part. The transfer logic 225 sends signals to manipulate the robot 215 and the end effector 213 to allow the end effector 213 to extend into the process module 118 to retrieve the consumable part. At the same time, the transfer logic 225 manipulates the actuator drive 206 to cause the actuators 204 to move the lift pins 202 out of a housing defined in the lift mechanism 221, thereby moving the consumable part 208 from an installed position to a raised position, as illustrated in FIG. 5B. The end effector 213 slides below the raised consumable part 208 substantially supporting it. The actuator drive 206 is then manipulated to cause the actuators 204 to retract the lift pins 202 into the housing in the lift mechanism 221 allowing the raised consumable part 208 to rest on the end effector 213 of the exchange handler 214. The end effector 213 of the exchange handler 214 is then manipulated to retract into the replacement station 108 bringing the consumable part 208 with it. The end effector 213 is then manipulated to move the retrieved consumable part 208 to a compartment 207 of the part buffer 224.

A new consumable part 208 is moved from a different compartment 207 of the part buffer 224 to the process module 118 in a similar manner. When the new consumable part 208 is moved into the process module 118, the actuator drive 206 is manipulated to cause the actuators 204 to extend the lift pins 202 out of the housing so as to receive the new consumable part 208. The actuators 204 allow the lift pins 202 to be lowered so that the consumable part 208 is set in an installed position in the process module 118. During the replacement of the consumable part, the vacuum state control 223 continually interacts with the vacuum control 231 to ensure that the pump 233 continues to keep the replacement station in a vacuum state so as to match the vacuum state maintained in the process module 118.

Once the consumable part 208 is replaced, the controller 220 is used to coordinate the withdrawal of the replacement station 108 from the process module 118. In accordance to this, the controller 220 sends a signal to the first isolation valve 216 to close the doors 217, 219 between the process module 118 and the replacement station 108, and a signal to the second isolation valve 216' to unlock the doors 227, 229 so as to allow the VTM 104 to access the process module 118.

In some implementations, the process module 118 may be conditioned before returning the process module to active operation. The conditioning operation may take a shorter time as the replacement of the consumable part was carried out in vacuum and only the process module 118 needs to be conditioned. A signal may then be sent from the vacuum state control 223 to the vacuum control 231 to allow the pump 233 to purge the replacement station 108. The replacement station 108 may then be dismounted from the process module 118.

Figure 5C:
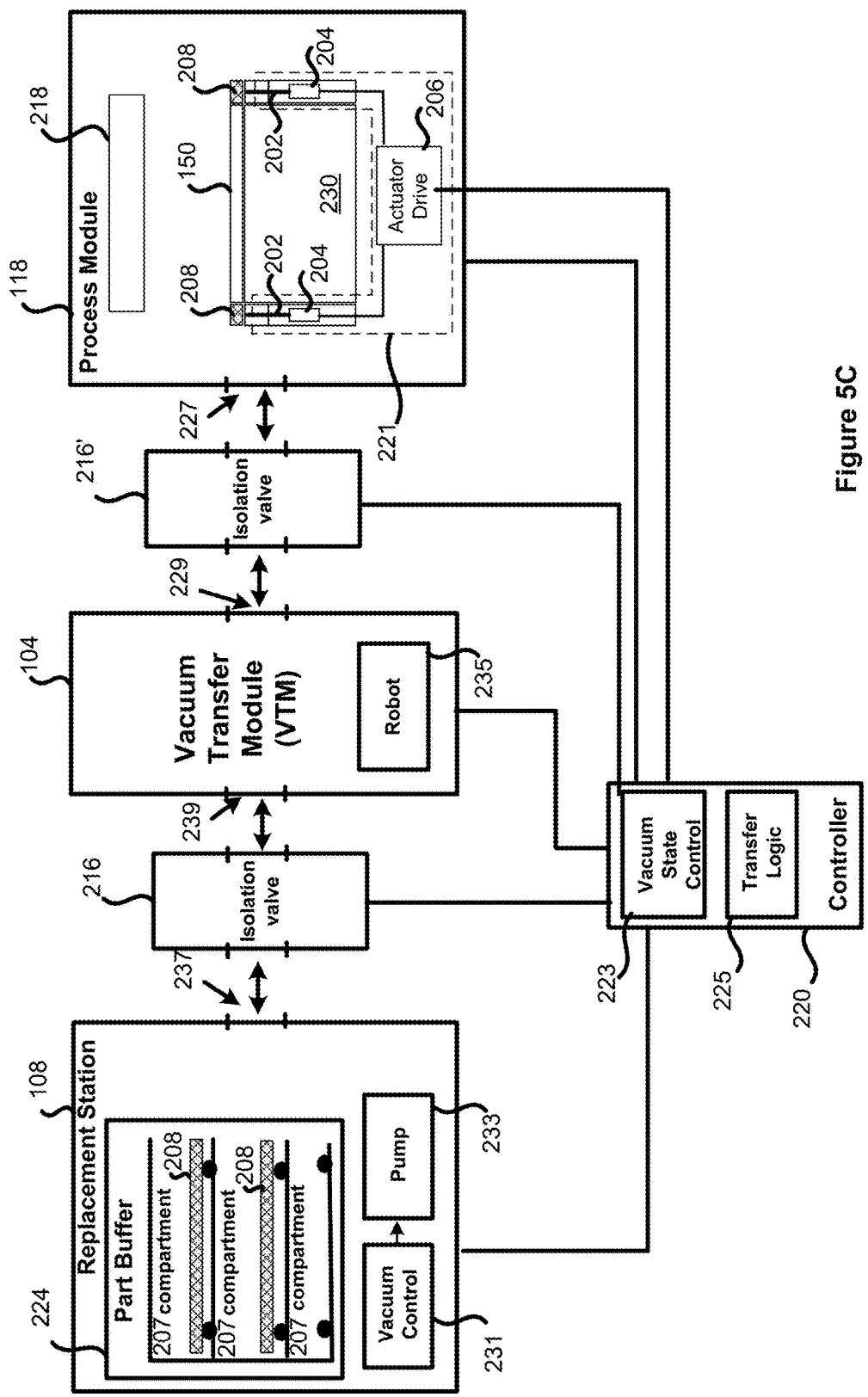
FIG. 5C illustrates a simplified block diagram of a process module with a replacement station mounted to a vacuum transfer module and a lift mechanism in the process module used in replacing the consumable part within the process module, in one embodiment of the invention.

FIG. 5C illustrates the process followed for replacing a consumable part within an embodiment of cluster tool assembly illustrated in FIG. 2, wherein the replacement station 108 is mounted to a VTM 104 instead of the process module 118. In this embodiment, the replacement station 108 is mounted to a vacuum transfer module (VTM) 104 through a first isolation valve 216, such that a first side of the first isolation valve 216 is coupled to a first side of the VTM 104. A replacement station 108 is coupled to the second side of the first isolation valve 216. A second isolation valve 216' is disposed such that a first side of the second isolation valve 216' is coupled to a process module 118 and a second side of the second isolation valve 216' is coupled to the second side of the VTM 104. The first isolation valve 216 is configured to manipulate doors 237, 239 that cover corresponding openings defined in the replacement station 108 and the VTM 104, respectively, and the second isolation valve 216' is configured to manipulate doors 227, 229, that cover corresponding openings defined in the VTM 104 and the process module 118, respectively, so as to allow a robot in the VTM 104 to access, retrieve and move the consumable part between the process module 118 and a compartment 207 in a part buffer 224 in the replacement station 108. The replacement station 108 illustrated in FIG. 5C does not include a dedicated exchange handler 214 with robot 215 and end effector 213. The robot 235 is operatively coupled to the controller 220 so as to allow the controller to coordinate operation of the robot 235. Further, the replacement station, the first isolation valve 216, the VTM 104, the second isolation valve 216' and the process module 118 are coupled to the controller 220 so as to synchronize access between the replacement station and the process module during replacement of the consumable part while the process module 118, the VTM 104 and the replacement station 108 are kept at a vacuum state.

The process of mounting the replacement station 108 to the VTM 104 is similar to the embodiment discussed with reference to FIG. 5A except that the replacement station 108 is mounted to the VTM 104 instead of the process module 118. The process of replacing the consumable part 208 is similar to the embodiment discussed with reference to FIG. 5A except the controller 220 coordinates with the robot 235 of the VTM 104 instead of coordinating with the robot 215, end effector 213 of the replacement station 108 discussed in FIG. 5A.

In an alternate embodiment, the replacement station 108 may include an exchange handler 214 (not shown) with a robot 215 and end effector 213, wherein the exchange handler 214 is operatively connected to the controller 220. The controller 220 is used to control coordination of the robot 215, the end effector 213, and the robot 235 during replacement of the consumable part. In this embodiment, the robot 215 and the end effector 213 may be used to retrieve and move the consumable part between the part buffer 224 and the VTM 104, and the robot 235 of the VTM 104 may be used to move the consumable part between the VTM 104 and the process module 108.

It should be noted that in the embodiment illustrated in FIG. 5C, the second isolation valve 216' is not used to isolate the process module 118 from the rest of the cluster tool assembly 100 during replacement of the consumable part. This is due to the fact that the access to the process module, in this embodiment, is provided through the VTM 104. As a result, second isolation valve 216' is configured to provide access when the consumable part needs to be replaced, while enabling selective isolation of the process module 118 during the processing of a semiconductor wafer. The conditioning of the cluster tool assembly 100 after replacement of the consumable part, in this embodiment, will take shorter time as the replacement station, the VTM 104 and the process module 118 are all maintained in a vacuum state during the replacement of the consumable part.

FIG. 6A illustrates an end effector mechanism 70 that is used in a robot 103 of an ATM 102 to transfer wafer between a wafer loader 115 and a loadlock chamber 110. As illustrated in FIG. 6A, the end effector mechanism 70 includes a wrist plate 701 that is connectable to a robot, such as robot 103 in the ATM 102, on one side and to a mounting armset on the other side. In some embodiments, the mounting armset is made of a single plate of stainless steel material. A finger assembly 705 is mounted to a second side of the mounting armset. In some embodiments, the finger assembly 705 is mounted to the mounting armset using a spring loaded mounting to provide a way of leveling adjustment of the finger assembly 705. The finger assembly 705 includes a pair of fingers 707 extending a length that is sufficient to support a wafer but is not sufficient to support a consumable part 208, as shown in FIG. 6A. In some embodiments, the wrist plate 701 and the finger assembly 705 of the end effector mechanism 70 is made of aluminum material. The length L1-a of the finger assembly 705, in some embodiments, is about 280 mm and the length L1-b of the fingers 707 is about 103 mm.

The fingers 707 of the finger assembly 705 may be extended to accommodate a consumable part 208. However, if the fingers 707 of the finger assembly 705 were to be extended, the stainless steel material used in the end effector mechanism 70 of FIG. 6A would cause deflection in the fingers 707 from the wafer transfer plane due to increase in payload caused by the extra material. The amount of deflection would make this end effector mechanism 70 less desirable for use in a tight space, such as space within a cluster tool assembly, where precision in the transfer plane is desired. So, instead of redesigning the finger assembly 705 to extend the fingers 707, the original design of the finger assembly 705 is maintained. The original design of the finger assembly 705 is used to transport the consumable part by allowing the finger assembly 705 to support a ring carrier. The ring carrier is, in turn, used to support the consumable part 208. Details of the ring carrier will be described with reference to FIGS. 8A-8B.

FIGS. 6B, 6B-1, and 6C illustrate an example end effector mechanism 700 that is used in the robot within the cluster tool assembly 100, in some embodiments. FIG. 6B illustrates a top view, FIG. 6B-1 illustrates a side view, and FIG. 6C illustrates a side-angled view of the example end effector mechanism 700 that is used to receive and transport the consumable part. The end effector mechanism 700 illustrated in FIGS. 6B, 6B-1, and -6C is re-designed to allow the end effector mechanism 700 to be able to transport a consumable part in addition to transporting a wafer. It should be noted that the end effector mechanism 700 illustrated in FIGS. 6B, 6B-1, 6C may be implemented in a robot 105 within the VTM 104 and/or in a robot 103 within the ATM 102. The re-designed end effector mechanism 700 includes a wrist plate 702 that is mountable to a robot at one end and to a mounting armset 704 at an opposite end. The mounting armset 704 is defined by a top plate 704a and a bottom plate 704b, as illustrated in FIG. 6B-1. The top plate 704a of the mounting armset 704, in some embodiments, is made of stainless steel material and the bottom plate 704b of the mounting armset 704 is made of aluminum. Variations in the material used for the top plate and the bottom plate may be implemented so long as the functionality of the mounting armset is maintained. In some embodiments, a spring loaded mounting may be effectuated between top plate 704a and the wrist plate 702.

A finger assembly 710 with a pair of fingers 706 is clamped between the top plate 704a and the bottom plate 704b of the mounting armset 704 with the pair of fingers 706 extending outward from the mounting armset 704. The finger assembly 710 of the end effector mechanism 704, in some embodiments, is made of ceramic material. The ceramic material provides stiffness to the fingers 706 and the finger assembly 710, thereby reducing deflection from a ring transfer plane, especially when supporting the wafer and/or the consumable part. Further, ceramic is lighter in weight, thereby resulting in reduced payload on the finger assembly 710. The clamping provides a stable mount of the finger assembly 710 while ensuring that it does not cause any stress cracking in the ceramic finger assembly 710. Further, the light-weight ceramic material allows the finger assembly 710 to be aligned substantially parallel to the ring transfer plane so that the consumable part can be smoothly transferred into and out of the loadlock chamber 110. A first pair of consumable contact pads 708a are defined at a proximal end of the finger assembly 710 and a second pair of consumable contact pads 708b are defined at a distal end of the finger assembly 710 proximal to the tips of the fingers 706 of the finger assembly 710. A length L3-a between the consumable contact pads 708a, 708b is defined to be about 301 mm. Similarly, a third pair of substrate contact pads 708c are disposed proximal to the first pair of consumable contact pads 708a and a fourth pair of substrate contact pads 708d are disposed proximal the second pair of consumable contact pads 708b. The third pair and the fourth pair of substrate contact pads are disposed to be inside the first pair and the second pair of consumable contact pads. A length L3-b between the substrate contact pads 708c, 708d is defined to be about 133 mm.

Referring now to FIG. 6B, the finger assembly 710 has a proximal end 710a that is defined adjacent to the mounting armset 704 and a distal end that is defined at tips of the pair of fingers 706. In some embodiments, the length L2-a is defined to cover at least a diameter of the consumable part 208, when received so as to allow the consumable part to be supported. For example, the length L2-a of the finger assembly 701 is defined to be at least about 360 mm, and length L2-b of the pair of fingers 706 is defined to be at least 182 mm. The finger assembly 710 is used to receive and transport both the consumable part 208 and the wafer. For example, the finger assembly 710 is configured to transport a 300 mm wafer as well as a consumable part, such as an edge ring, that surrounds the 300 mm wafer. In other embodiments, the finger assembly 710 is configured to transport a 200 mm wafer, or a 450 mm wafer, or wafer of any other dimension, as well as a consumable part, such as an edge ring, that surrounds the respective sized wafer. In these embodiments, the finger assembly 710 is sized to support the appropriately sized wafer and consumable part.

To assist in the transportation of the consumable part 208 and the wafer, a plurality of contact pads are provided on a top surface of the finger assembly 710 at varying distances so as to support the consumable part and the wafer, when received. In some embodiments, separate sets of contact pads are provided to allow the consumable part and the wafer to have distinct contact surfaces on the finger assembly 710. This arrangement may be desirable to reduce contamination of the wafer using the same finger assembly that is used to transfer the consumable part. A first pair of consumable contact pads 708a may be disposed on the top surface of the finger assembly 710 and is located at or near the proximal end 710a that is close to the mounting armset 704. A second pair of consumable contact pads 708b is disposed on the top surface of the finger assembly 710 and is located at or near the distal end 710b that is close to the tips 706a of the pair of fingers 706. The first pair 708a and the second pair 708b of the consumable contact pads are used for transferring the consumable part. Similarly, a third pair of substrate contact pads 708c is disposed on the top surface of the finger assembly 710 adjacent to the first pair of consumable contact pads and between the first pair and the second pair of consumable contact pads, 708a, 708b. A fourth pair of substrate contact pads 708d is disposed on the top surface of the finger assembly 710 adjacent to the second pair of consumable contact pads and between the first and the second pair of consumable contact pads, 708a, 708b. The third pair and the fourth pair of substrate contact pads 708c, 708d, are used to transport the wafer. The consumable contact pads 708a, 708b are disposed outside of a diameter of the wafer and the substrate contact pads 708c, 708d are disposed inside of a diameter of the wafer. This design allows separation of the receiving surface of the wafer and the consumable part 208 on the finger assembly 710 so as to minimize contamination of the wafer.

The contact pads, in some embodiments, are made of non-skid material, such as an elastomer material. The location of the consumable contact pads 708a, 708b, on the top surface of the fingers 706 is such that when the end effector mechanism 710 of the robot lifts the consumable part 208, the contact pad provides a reliable contact support to a bottom surface of the consumable part 208. In some embodiments, more than one set of consumable contact pads 708a, 708b may be provided at the proximal end 710a and the distal end 710b of the finger assembly 710, such that they are able to provide reliable contact support. In some embodiments, the additional consumable contact pads 708 may be disposed to provide contact support for a bottom surface of a consumable part 208 with a distinct bottom surface profile that may require more than one contact point.

FIGS. 7A-7D illustrate specific embodiments of the finger assembly 710 used in an end effector mechanism 700 for supporting consumable parts 208 having different bottom surface profiles. The consumable part 208, in some embodiments, may be an edge ring that is disposed adjacent to a wafer, when the wafer is received in a process module 112, for example. The edge ring may have different cross sectional profiles at the bottom surface and the consumable contact pads 708 are disposed on the top surface of the finger assembly 710 to accommodate the different surface profiles of the consumable part 208.

FIG. 7A illustrates an embodiment, wherein a cross section of a bottom surface edge of the consumable part 208 is substantially rectangular. In this embodiment, a consumable contact pads 708 disposed at a top surface of the finger assembly 710 provides sufficient contact surface, when the consumable part 208 is properly aligned and received on the finger assembly 710 of the end effector mechanism 700. In some implementations, the consumable contact pads 708a, 708b are separated by a distance that is equal to at least a diameter of the consumable part. In the embodiment illustrated in FIG. 7A, the consumable contact pad 708 is disposed such that it contacts a bottom surface of the consumable part 208 at mid span.

FIG. 7B illustrates an alternate cross sectional profile of the bottom surface of the consumable part 208, in one embodiment. The consumable part 208 includes a cut in the bottom surface at an outer diameter of the consumable part 208. The location of the consumable contact pad 708 disposed on a top surface of the finger assembly 710 ensures that the consumable contact pad continues to provide contact support the consumable part 208 and does not miss the bottom surface of the consumable part 208 so long as the alignment of the consumable part 208 on the fingers 706 is within pre-defined position error limits.

FIG. 7C-1 illustrates a second alternate cross sectional profile of the bottom surface of the consumable part 208, in one embodiment. The consumable part 208 includes a cut out in the middle of the bottom surface. If the consumable contact pad 708 disposed at a distance illustrated in FIGS. 7A and 7B were to be used, the contact pad 708 will not provide sufficient contact with the bottom surface of the consumable part 208, as illustrated in FIG. 7C-1. This would cause the consumable part to be received on the top surface of the fingers 706 instead of the surface of the consumable contact pad 708. As the pair of fingers 706 are made of ceramic material with fine finish, there is a high likelihood that the consumable part 208 received on the pair of fingers 706 may get misaligned during its transportation—a highly undesirable outcome. In order to avoid such misalignment from occurring, additional consumable contact pads may be provided on the finger assembly 710 at different distances so as to ensure that the bottom surface of the consumable part 208 with the cut-out, when received on the finger assembly 710, makes sufficient contact with one or more consumable contact pads 708 disposed on the pair of fingers 706. The consumable contact pads are defined on the finger assembly 710 so as to support consumable part 208 of expected cross section through a range of expected position error, while also staying outside of an expected range of wafer offset such that the wafer, when received never touches the consumable contact pads. FIG. 7C-2 illustrates one such example, where a set of two consumable contact pads 708 are provided on the finger assembly 710 at different distances so as to provide reliable contact support at the bottom of the consumable part 208. The distance between the two consumable contact pads 708 may be configured in accordance to width of the cut-out.

FIG. 7D illustrates a third alternate cross sectional profile of the bottom surface of the consumable part 208, in one embodiment. In this embodiment, the consumable part 208 includes a smaller inner diameter lip so as to allow a wafer to be received over the lip of the consumable part, when received in a process module. The bottom surface of the consumable part 208, in this embodiment, includes a larger surface area than the ones illustrated in FIGS. 7A-7C. As a result, the consumable contact pad 708 disposed on the finger assembly 710 would provide sufficient contact support for the consumable part 208 during transportation. Some embodiments may use a different type of contact pad concept than what is shown in FIGS. 7A-7D.

FIG. 7E illustrates the end effector mechanism 700 depicted in a robot 105 within the VTM 102 and FIGS. 7F-1, 7F-2 show details of an alternate contact pad concept used in the end effector mechanism 700, to enable receiving consumable part of varying bottom profiles. The various components of the end effector mechanism 700 illustrated in FIG. 7E are similar to what was discussed with reference to the end effector mechanism 700 depicted in FIG. 6A.

FIGS. 7F-1 and 7F-2 illustrate the alternate contact pad concept used in the end effector mechanism 700 for receiving consumable part, in some embodiments. FIG. 7F-2 shows an expanded view of a portion A-1 of a finger 706 within the finger assembly 710 where an alternate contact pad concept is defined. In such embodiments, a ring-shaped contact structure 709 may be used instead of consumable contact pads 708. In some embodiments, the ring-shaped contact structure 709 may be in the form of an o-ring made of elastomeric material. Using the o-ring or ring-shaped contact structure 709 allows for a ring shaped line contact that spans a larger range of the consumable part radius. It also addresses consumable part bottom profile variation issues that are described with reference to FIGS. 7A-7D and provides more tolerance of position error on the end effector mechanism 700. In some embodiments, the consumable contact pads or ring-shaped contact structure and wafer contact pads are defined to be a permanent part of the end effector mechanism 700. In such embodiments, the contact pads (consumable, wafer contact pads) and/or contact structure may be made of ceramic material or any other metal that is suitable for the environment defined in the ATM 102 or the VTM 104. In other embodiments, the consumable, wafer contact pads or contact structure may be made of a replaceable, consumable material, such as elastomer or other similar type of material.

Referring back to FIGS. 6B-6C, the end effector mechanism 700 illustrated in FIGS. 6B-6C may be employed by a robot 105 within a vacuum transfer module 104, and in some embodiments in a robot 103 within the ATM 102, as well. In alternate embodiments, the end effector mechanism 700 of FIGS. 6B-6C may be employed by the robot 105 of the VTM 104 while configuration of the end effector mechanism 70 illustrated in FIG. 6A or a re-designed end effector mechanism 70 or 700 may be implemented within the robot 103 of the ATM 102.

Figure 8B:
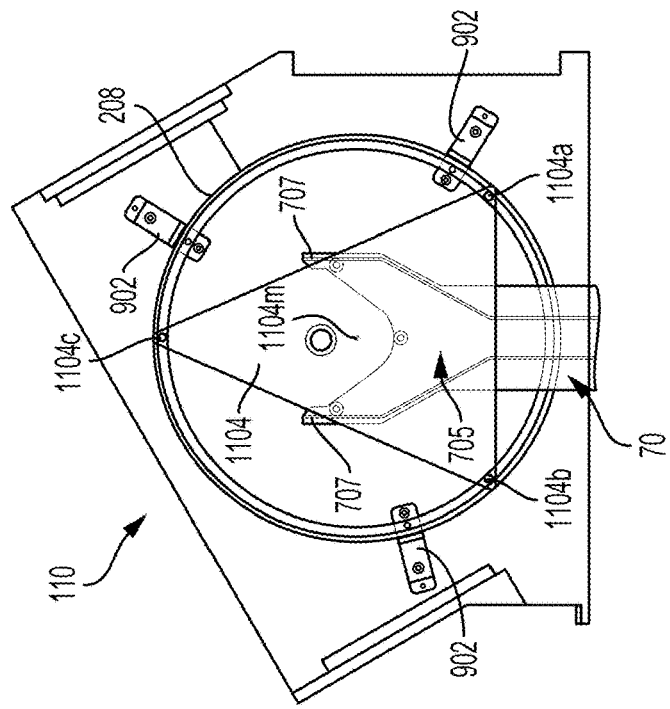
FIGS. 8A-8B illustrate example end effector mechanisms used to deliver substrate and consumable part into a loadlock chamber, in accordance with some embodiments of the invention.
Figure 8A:
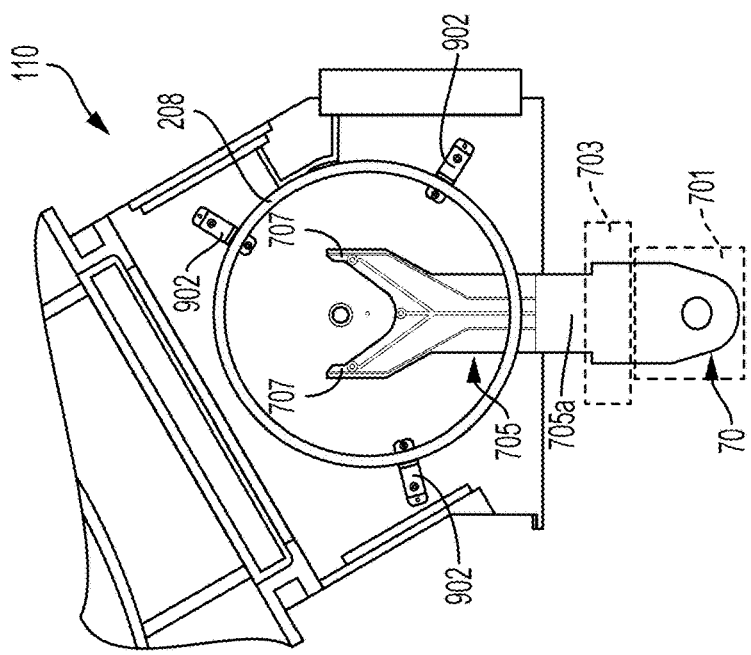

FIGS. 8A-8B illustrate top views of different end effector mechanisms used in robots within the ATM 102 and the VTM 104, in some embodiments of the invention. As mentioned earlier, the robot 103 in the ATM 102 may use either an existing end effector mechanism 70 with short fingers and a carrier plate, or a modified end effector mechanism 700 with extended fingers to move the wafer as well as the consumable part. FIG. 8A illustrates a top view of an existing end effector mechanism 70 integrated within the robot 103 of the ATM 102 that is typically used to deliver a wafer to a loadlock chamber 110. The existing end effector mechanism 70 may also be used to deliver a consumable part to the loadlock chamber 110. As can be seen in FIG. 8A, the pair of fingers 707 defined in the end effector mechanism 70 are designed to provide contact support for a wafer (not shown) and are not designed to provide contact support for the consumable part 208, which has a larger radius than the wafer. In order to enable the end effector mechanism 70 to be used for supporting and transferring the consumable part, a ring carrier fixture is used.

FIG. 8B illustrates an example embodiment wherein a ring carrier fixture is used with the end effector mechanism 70 in the robot 103 of the ATM 102, to transport the consumable part 208 between a replacement station 108 and the loadlock chamber 110. The ring carrier fixture may be in the form of a carrier plate 1104. In some embodiments, the carrier plate 1104 is made of carbon fiber material. The carbon fiber is light in weight and is ideal for use as it minimizes increase in the payload on the finger assembly 705. The carbon fiber also provides sufficient stiffness to minimize deflection.

In some embodiments, the carrier plate 1104 is configured to be triangular in shape and is sized such that distance of the apexes (1104a, 1104b, 1104c) from a center 1104m of the carrier plate 1104 is at least equal to a radius of the consumable part 208. The triangular shape design of the carrier plate has many advantages. For example, the triangular shape of the carrier plate allows the carrier plate 1104 with the consumable part 208 received thereon, to be moved easily into and out of the loadlock chamber 110 without interfering with any components defined within the loadlock chamber 110. This is possible as the apexes 1104a-1104c enable the carrier plate 1104 to easily move between the finger assemblies 902, for example, defined in the loadlock chamber 110 while maintaining sufficient clearance. Further, as the apexes 1104a-1104c are distributed equidistant from the center of gravity 1104m defined in the center of the triangular shaped carrier plate 1104, the consumable part 208 can be properly supported at the apexes without providing undue stress on any one side.

In one embodiment, the carrier plate 1104 is stored within the replacement station 108 and retrieved by the robot 103 of the ATM 102 using the end effector mechanism 70. In some embodiments, the end effector mechanism 70 provided in the robot 103 of the ATM 102 may be configured to provide sufficient suction force when picking the carrier plate 1104 so that the carrier plate 1104 can be securely received and carried on the end effector mechanism 70. In some embodiments, different carrier plates 1104 may be used to separately transport used and new consumable parts. For example, a first carrier plate may be used to transport used consumable part and a second carrier plate may be used to transport new consumable part.

Using the end effector mechanism 70 with a ring carrier in the form of carrier plate 1104, has its advantages. For example, the existing end effector mechanism 70 may be used and there is no need to re-design the existing end effector mechanism 70. Re-design of the end effector mechanism 70 to support a ring may require a shape change that may interfere with wafer supports or other hardware at various wafer hand-off locations. Such clearance issues may be addressed by changing robot arm trajectories of the robot in the ATM, but trajectory changes may increase wafer transfer times reducing system throughput. The alternative use of a ring carrier allows the use of current trajectories for wafer transfer without any changes to wafer through-put. As necessary, ring transfer specific trajectories can be defined leaving the wafer transfer trajectories unchanged. Further, it has less impact on the existing firmware. In some embodiments, the ring carrier (in the form of carrier plate 1104) may increase the payload which may contribute to deflection from a ring transfer plane. However, by using appropriate light-weight material, such as carbon fiber, for the ring carrier, any increase in the pay load and resulting deflection may be substantially minimized.

Figure 9B:
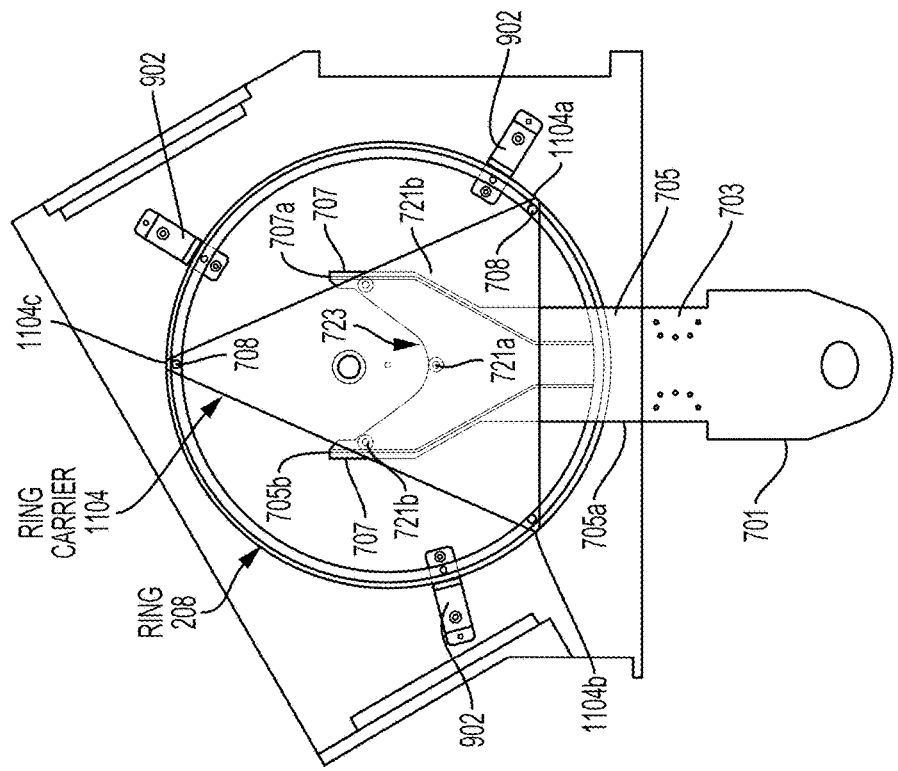
FIGS. 9A-9B illustrate example side and top view of an end effector mechanism with ring carrier that is used to deliver consumable part to a loadlock chamber, in accordance with some embodiments of the invention.
Figure 9A:
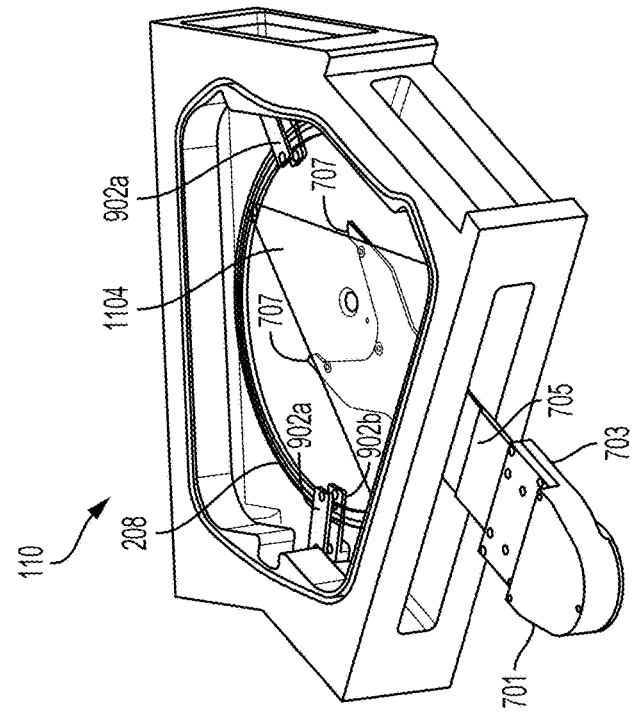

FIGS. 9A and 9B illustrate a side and top view of an example end effector mechanism 70 that is used with a ring carrier 1104 for transferring consumable part 208 into the loadlock chamber 110, in some embodiments. The end effector mechanism 70 includes a wrist plate 701 that is attachable to the robot 103 at one end and to a mounting armset 703 at the opposite end. A finger assembly 705 is attached to a second end of the mounting armset 703. The finger assembly 705 includes a pair of fingers 707 extending outward from the mounting armset 703. The finger assembly 705 has a proximal end 705a proximal to the mounting armset 703. A distal end 705b of the finger assembly 705 is defined at finger tips 707a of the pair of the fingers 707. A first carrier contact pad 721a is disposed on a top surface of the finger assembly 705 proximal to a center of a fork 723 that is formed at a base of the fingers 707. A second pair of carrier contact pads 721b is disposed on the top surface of the finger assembly 70 and located proximal to the distal end (705b) of the finger assembly 705. A carrier plate 1104 is supported on the finger assembly 705 using the first carrier contact pad 721a and the second pair of carrier contact pads 721b. The finger assembly 705 is also configured to transport a substrate or wafer. It should be noted that, in some embodiments, the existing end effector mechanism 70 with the ring carrier (in the form of carrier plate 1104) may only be used with the robot of the ATM 102 as it is convenient to store and retrieve the carrier plate 1104 from the replacement station 108 and there is no need to re-engineer any of the other modules for storing the carrier plate 1104. The carrier plate 1104 includes a consumable contact pad 708 disposed at each of the apexes 1104a-1104c at a distance from the center of the carrier plate 1104 that is outside a radius of the substrate. In some embodiments, the distance of the consumable contact pads 708 from the center of the carrier plate 1104 is at least a radius length of the consumable part 208, so as to provide a non-skid contact surface for the consumable part, when received on the apexes of the carrier plate 1104. As discussed with reference to the embodiments illustrated in FIGS. 7A-7D, the consumable contact pads 708 may be provided at different distance from the apexes of the carrier plate 1104. In some embodiments, each apex may include a pair of consumable contact pads 708 disposed equidistant from each of the apexes 1104a-1104c. In alternate embodiments, a plurality of consumable contact pads 708 may be defined at different distances from each of the apexes 1104a-1104c so as to allow the contact pads to provide reliable contact surface for the consumable part 208 with different bottom surface profiles.

In addition to including a modified end effector mechanism 700 within a robot of the ATM 102 and/or the VTM 104, additional modifications may be provided within the loadlock chamber 110 to allow the consumable part to be received therein during a replacement operation.

Figure 10C:
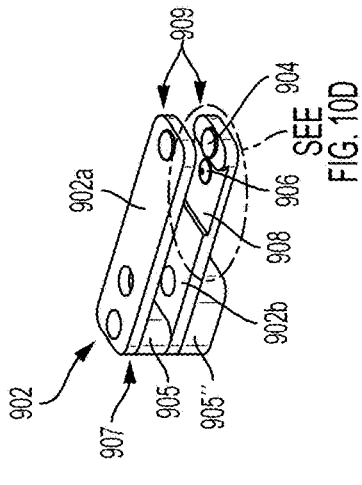
FIGS. 10A-10D illustrate example finger assembly used within a loadlock chamber that is configured to receive consumable part, in accordance to some embodiments of the invention.
Figure 10B:
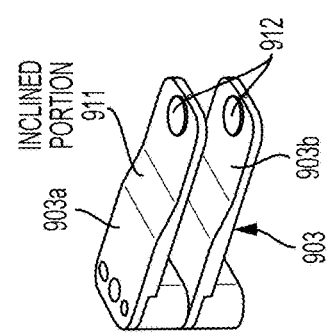
Figure 10A:
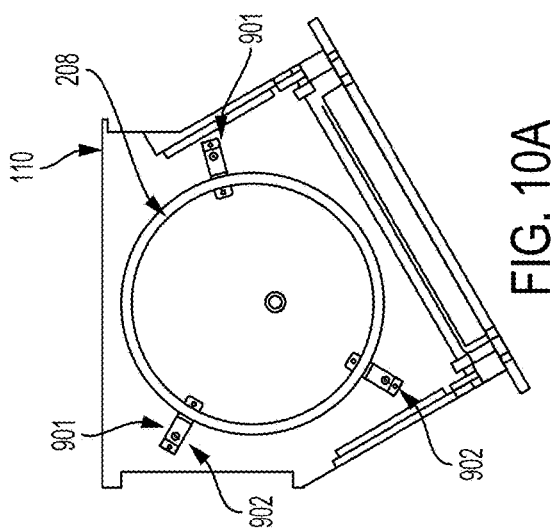

FIGS. 10A-10F provide various views and details of a support mechanism engaged within the loadlock chamber 110 to receive and support the consumable part, in some embodiments. FIG. 10A illustrates an overhead view of a simplified loadlock chamber 110 that is interfaced between an ATM 102 and VTM 104 within a cluster tool assembly 100 in which a consumable part 208 needs to be replaced, in one embodiment. The loadlock chamber 110 includes a support mechanism 901 for receiving the consumable part 208. The support mechanism 901 includes a plurality of finger assemblies 902 that provide the contact surface onto which the consumable part is received. The finger assemblies 902 are disposed at fixed locations within the loadlock chamber 110. In some embodiments, the finger assemblies 902 are configured to have mutually exclusive contact points for receiving wafers and consumable parts to avoid cross contamination, as will be described in the following paragraphs. It should be noted that the contact points may be at different heights or radial distances to accomplish exclusive separation within expected wafer or consumable part position error.

FIG. 10B illustrates an existing finger assembly 903 within the loadlock chamber 110 that was designed for receiving a wafer. Each finger assembly 903 included a top support finger 903a and a bottom support finger 903b. As shown, a top surface of both the top support finger 903a and the bottom support finger 903b was designed to include a portion that is inclined downward 911. A contact pad 912 was defined proximal to a tip of the top and the bottom support fingers 903a, 903b, to provide a non-skid contact surface for the wafer, when received. A spacer block is defined to support the top and bottom support fingers 903a, 903b. A thickness the spacer block is designed to provide sufficient clearance for receiving a wafer. However, the clearance provided by the spacer block of FIG. 10B is not sufficient for receiving a consumable part, which has a larger radius than the wafer. In order to accommodate the consumable part, the finger assembly in the loadlock chamber is re-designed so as to avoid interference with components of the loadlock chamber when receiving the consumable part.

FIG. 10C illustrates an example re-designed finger assembly 902 of a support mechanism 901 that is used within the loadlock chamber 110 to enable a consumable part to be received thereon, in one embodiment of the invention. The support mechanism 901 includes a plurality of finger assemblies 902. In one embodiment illustrated in FIG. 10A, the support mechanism includes three finger assemblies distributed equidistant from one another along a circumference of a circle. Each of the plurality of finger assemblies 902 includes a top support finger 902a and a bottom support finger 902b. A top surface of the bottom support finger, in one embodiment, is designed to include an indent 908 proximal to a second end of the bottom support finger 902b while a spacer block is disposed between the top support finger 902a and the bottom support finger 902b at a first end. In order to fully accommodate the consumable part, the spacer block 905 is re-designed to provide sufficient clearance to allow the consumable part 208 to be fully received on the finger assembly 902. In the embodiment illustrated in FIG. 10C, the spacer block 905 is shown to be moved farther out from the center of the loadlock chamber 110, closer to a sidewall of the loadlock chamber 110 so as to not interfere with a transfer path of the consumable part. A second spacer block 905" may be disposed below the bottom support finger 902b at the first end and be of same size, thicker or thinner than the re-designed spacer block 905. In some embodiments, instead of providing a spacer block 905, the finger assembly could include a finger support for supporting the top support finger and the bottom support finger while providing a gap there-between. Additionally, in one embodiment illustrated in FIG. 10C, the bottom support finger 902b in each finger assembly 902 within the loadlock chamber 110 is re-designed to include an indent 908 on a top surface at a distance that is equal to at least a radius of a consumable part. A size of the indent 908, in one embodiment, is designed to be at least a width of the consumable part. One or more contact pads are defined on the surface of the finger assemblies 902 to provide a non-skid contact support surface for the wafer as well as the consumable part 208, when received. For example, a substrate contact pad 904 is disposed on a top surface of the top and the bottom support fingers 902a, 902b, at the second end of the finger assembly that is proximal to a tip of the top and bottom support fingers 902a, 902b. In some embodiment, the substrate contact pads 904 are defined at a distance from a center of the support mechanism that is equal to a radius of a wafer so as to provide contact support surface for the wafer, when received. Further, consumable contact pads 906 are defined in the indent 908 of the bottom support finger 902b to provide a contact support for the consumable part 208. Based on a bottom surface profile of the consumable part, additional contact pads 906 may be defined in the indent 908.

In some embodiments, the substrate contact pads 904 at the top support finger 902a may be used to receive the wafer while the consumable contact pad within the indent may be used to receive the consumable part. In alternate embodiments, the top support finger 902a may include the indent 908 with a consumable contact pad 906 for receiving the consumable part 208, while the substrate contact pad 904 on the surface of the bottom support finger 902b may be used to receive the wafer. In an alternate embodiment, the indent 908 may be provided in both the top and the bottom support fingers 902a, 902b. In this embodiment, both the top and the bottom support fingers 902a, 902b are configured to receive the consumable part 208 and the wafer. It should be noted that the consumable part 208 and the wafer are not received on the finger assembly at the same time. In some implementations, it may however be possible to receive the consumable part and the wafer simultaneously by allowing the consumable part to be received at the bottom support fingers 902b while using the top support fingers 902a to receive the wafer or vice versa. In such embodiments, the design positions of the wafer contact pads and the consumable contacts pads is such that the contact surface for receiving the consumable part 208 is kept separate from the contact surface that is used for receiving the wafer to avoid cross-contamination. It should be noted that the wafer contact pad locations are defined such that a wafer received at an extreme of allowed position error will not contact the consumable contact pads. Similarly, the consumable part received at the extreme of allowed position error shall not contact the wafer contact pads. The separation of the contact receiving surfaces is to avoid cross-contamination of the wafer, when received on the finger assembly. In some embodiments, instead of using distinct contact pads, a ring-shaped contact structure may be disposed in the indent 908 defined in the bottom support fingers 902b and/or the top support fingers 902a. The ring-shaped contact structure may be made of elastomer material and could be an o-ring. The contact surface provided by the ring-shaped contact structure spans a larger range of the consumable part radius.

A consumable part, such as an edge ring, disposed close to the wafer within a process module, is exposed to the harsh processing conditions that the wafer is exposed to within the process module. As a result, some of the processing chemicals may have settled on the surface of the consumable part as contaminants. When the consumable part is to be replaced in the process module, the used consumable part with the contaminants is removed from the process module and received into the loadlock chamber 110 and the new consumable part is moved from the loadlock chamber 110 to the process module. As the loadlock chamber 110 is used to move both the consumable part and the wafer into and out of the process modules, if the contact support surface is common for receiving both the consumable part and the wafer, there is a high likelihood that the contaminants from the used consumable part may contaminate the surface of the wafer. In order to prevent such contamination from occurring, one solution is to use separate loadlock chambers 110 to separately move the wafer and the consumable part. This arrangement may be viable but may severely affect the wafer throughput as only one of the two loadlock chambers 110 will be available for moving the wafer.

In order to maintain the wafer throughput and avoid potential wafer contamination, an alternate solution is to allow the available loadlock chambers 110 within the cluster tool assembly 100 to be used to move the new and used consumable parts 208 as well as the pre-processed and processed wafers, in one embodiment. For instance, in one embodiment, the top and the bottom support fingers 902a, 902b may provide separate receiving areas for the consumable part and the wafer. In such embodiment, the plurality of contact pads provided at the finger assemblies allows the contact surface of the wafer to be kept at a separate height from the contact surface of the consumable part. In the case of a consumable part that is in the form of a ring (i.e., edge ring), by maintaining the contact surface of the ring at a different height from the wafer contact surface, wafer surface contamination can be avoided or minimized.

Figure 10D:
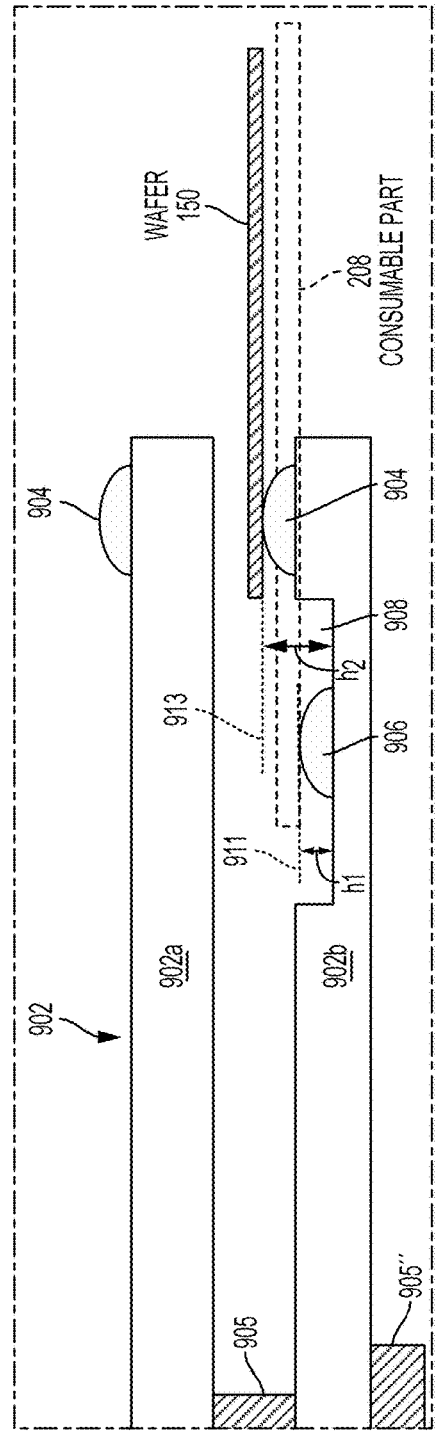

FIG. 10D illustrates an expanded view of one such finger assembly 902 within the loadlock chamber 110 that is used to support both the wafer and the consumable part, in one embodiment. An indent 908 is defined on a top surface of the bottom support finger 902b. One or more consumable contact pads 906 are disposed in the indent 908 for receiving the consumable part 208 and one or more substrate contact pads 904 are disposed near a tip of the support fingers 902a, 902b for receiving the wafer. On the bottom support finger 902b, the consumable contact pads 906 for receiving the consumable part, in one embodiment, are disposed at a distance from a center of the support mechanism that is at least equal to a radius of the consumable part 208 and the substrate contact pads 904 for receiving the wafer are disposed at a distance from the center of the support mechanism that is equal to at least the radius of the wafer. The consumable contact pads 906 disposed in the indent 908 of the plurality of finger assemblies 902 define a ring receiving plane 911 for receiving the consumable part 208, and the contact pads 904 disposed on the finger assemblies 902 define a wafer receiving plane 913 for receiving the wafer. The indent 908 allows the ring receiving plane 911 to be disposed at a different height than the wafer receiving plane 913, separating the contact support surface for the wafer from that of the consumable part. This separation in the contact support surface is designed to protect the surface of the wafer from contamination by preventing the wafer from coming in contact with any portion of the contact support surface used for receiving the consumable part. In one embodiment, the ring receiving plane 911 is at a lower height ($h_1$) than the wafer receiving plane 913 ($h_2$) (i.e., height $h_1 < h_2$). In one embodiment, the difference between $h_2$ and $h_1$ is at least greater than the height of the consumable part 208. In another embodiment, height $h_1 > h_2$, such that the wafer is received at a lower height and the consumable part is received at a higher height while separating the wafer receiving surface from the consumable part receiving surface.

Of course, the finger assembly design illustrated in FIGS. 10C and 10D is one example of keeping the contact surface of the wafer and the consumable part separate. Other designs may be employed including the finger assembly design where the height $h_1 > h_2$. In this design, a cut-out may be defined at the tips on a top surface of the support fingers 902a, 902b. Surface formed by the cut-out may be used to receive the substrate contact pads 904 for supporting a wafer while a consumable part may be received on the consumable contact pads 906 defined in an indent 908 at the top surface of the bottom support finger 902b. In one embodiment, the cut-out may be formed on the top and/or bottom support fingers 902a, 902b such that it defines a wafer receiving surface for receiving the wafer that is at least at a distance from the center of the support mechanism 901 that is equal to a radius of the wafer and substrate contact pads 904 may be provided thereon for providing a reliable contact support surface for the wafer. Similarly, consumable contact pads provided in an indent 908 defined in the top surface of the support fingers 902a, 902b, provide the contact support surface for the consumable part.

FIGS. 10E and 10F illustrate example airlock chambers before and after redesigning of the support mechanism 901, in some embodiments. The support mechanism 901 includes a plurality of finger assemblies that have been re-designed to accommodate transporting of the consumable part as well as the wafer. The re-designed finger assemblies provide a simple, easy and cost effective solution as it enables the consumable part 208 to be received into the loadlock chamber 110 without having to re-design the loadlock chamber 110 completely. As illustrated in FIG. 10E, in order to fully receive a consumable part 208 on the bottom support finger 902b of the finger assembly within the support mechanism 901, the spacer block 905' has to be re-designed to be moved out of the transfer path of the consumable part. The existing design shown in FIG. 10E shows a spacer block 905' that interferes when receiving the consumable part on the bottom support finger 902b. FIG. 10F illustrates an example embodiment wherein a re-designed spacer block 905 is engaged. The re-designed spacer block 905 is shown to be moved farther from the airlock center, closer to the sidewall. As mentioned earlier, the top and the bottom support fingers may be supported and separated by the re-designed spacer block 905, or alternately by a finger support (not shown) that provides sufficient clearance for allowing the consumable part to be fully received on the bottom support finger.

In order to fully receive the consumable part 208 on a top support finger 902a, there has to be sufficient vertical clearance so as to avoid interference caused by the inside edge radius of the loadlock chamber 110 and such interference may be experienced when moving the consumable part into and out of the loadlock chamber 110. The finger assemblies are designed to take this limitation into consideration by providing at least a minimal clearance between an "exclusion zone" of the consumable part and the upper and lower slot corners of the loadlock chamber. The exclusion zone, as used in this application, refers to a cross-section of the largest consumable part design (e.g., outside diameter and height) and a perimeter offset representing a stack up of tolerances. The tolerance stack up includes position error effects due to leveling, end effector deflection, robot arm trajectory, robot teaching and other tolerance contributors. The upper and lower slot corners are defined as respective areas over an edge of the top and the bottom support fingers of the support mechanism within the loadlock chamber where the consumable part is received. In some embodiments, the minimal clearance defined between the exclusion zone and the slot corner is between about 0.01" to about 0.03". In other embodiments, the minimal clearance is about 0.025".

The finger assemblies 902 are designed such that there is at least a minimal nominal clearance between the consumable part received on the finger assemblies and a sidewall 110a of the loadlock chamber 110. In some embodiments, the minimal nominal clearance is designed to at least be between about 5 mm to about 6 mm. In other embodiments, the minimal clearance is about 5.4 mm. In some embodiments, the minimal nominal clearance to the sides of the loadlock chamber 110 is defined so as to account for consumable part misplacement or position offset that can be corrected by the VTM robot using the dynamic alignment input.

Further, a height of the spacer block 905 in the finger assemblies 902 should be defined so as to provide sufficient vertical clearance between the top and the bottom support fingers 902a, 902b, to allow the consumable part received on the bottom support finger 902b to be moved into and out of the loadlock chamber 110 without any interference. In some embodiments, the spacer blocks 905 in the finger assemblies 902 are designed so as to provide a minimal gap between a top surface of the consumable part received on the bottom support finger 902b and a bottom surface of the top support finger 902a to define a ring transfer plane for moving the consumable part along. In some embodiments, the minimal gap is between about 4 mm and 5 mm. In some embodiments, the vertical clearance defined by the gap is about 4.6 mm. In some embodiments, the vertical clearance between the top support finger and the bottom support finger is designed to provide at least a minimum clearance of about 2 mm to about 3 mm above and below the consumable part when being transferred into and out of the loadlock chamber 110. In another embodiment, the vertical clearance between the top support finger and the bottom support finger is designed to be at least about 2.3 mm above and below the consumable part, to enable transfer. In some embodiments, the vertical clearance is defined to take into account any payload deflection that exists at the end effector mechanism during transfer.

In one embodiment, a high level operation for replacing a consumable part within a cluster tool assembly 100 will now be discussed. As described with reference to FIGS. 3 and 3A, the cluster tool assembly 100 includes one or more load ports to which a wafer loader 115 or a replacement station 108 is permanently or temporarily mounted, an ATM with a first robot for moving the consumable part and the wafer, a loadlock chamber, a VTM with a second robot, and one or more process modules. The consumable part is disposed in the process module and may need to be replaced periodically so that wafer processing can be efficiently effectuated.

In one embodiment, when the consumable part needs to be replaced in a process module, all the process modules integrated with the VTM are brought to an idle state. This means that no wafers are in the cluster tool assembly except where a closed wafer loader is engaged. At least one load port at the ATM is kept free for receiving the replacement station 108, if the replacement station is temporarily mounted. In this embodiment, the cluster tool assembly 100 is not set for simultaneous handling of wafer processing and replacement of the consumable part. In an alternate embodiment, the cluster tool assembly may be configured to simultaneously handle both the replacement of the consumable part and wafer processing. In such embodiment, access to the various modules are coordinated to allow efficient movement of the consumable part and the wafer.

In one embodiment, the replacement station 108 with the replacement consumable part is mounted to the free load port within the cluster tool assembly 100. In one embodiment, the mounting is done manually. In an alternate embodiment, the mounting is done using a robot. In the embodiment illustrated in FIG. 3A, a FOUP type replacement station may be delivered in an automated manner using an Overhead Hoist Transfer (OHT) or Automatic Guided Vehicle (AGV), which may be part of an Automated Material Handling System (AMHS). In one embodiment, the AMHS is installed in a host fabrication facility. The AMHS, in some embodiments, may include an automated stocker where the FOUP type replacement station and/or the wafer loader are stored. The AMHS may include tracking software to guide the OHT or the AGV to the appropriate replacement station or the wafer loader, so that the appropriate replacement station or the wafer loader may be retrieved from the stocker and mounted to a free load port within the cluster tool assembly. The OHT or the AGV, in some embodiments, may be equipped with radio frequency identifier (RFID) tag readers or barcode readers to pinpoint the location of the replacement station or the wafer loader within the stocker of the AMHS. In some embodiments, the stocker may include rows of replacement stations and/or wafer loaders. In such embodiments, the software may guide the OHT or the AGV to the appropriate row and the barcode readers or RFID tag readers may be used to identify specific replacement station or the wafer loader to retrieve from the row. In one example, the OHT or the AGV may therefore retrieve the replacement station and automatically mount it to a free load port defined in a first side of the ATM of the cluster tool assembly.

Upon mounting the replacement station 108, a transfer sequence is initiated on a user interface of a computer that is communicatively connected to the cluster tool assembly. The transfer sequence causes the replacement station 108 to be loaded to the cluster tool assembly. In some embodiment, upon loading the replacement station, a consumable part mapping is done by the ATM robot 103. The mapping may be to provide dynamic alignment input so that the consumable part can be aligned when moved into the loadlock chamber.

Simultaneously or sequentially, the VTM robot 105 removes the used consumable part from a process module 112 in the cluster tool assembly 100 and transfers the used consumable part 208 to the loadlock chamber 110. The VTM robot 105 moves the consumable part 208 using planar transfer by coordinating lift pin motion within the process module 112. More information on the lift pin mechanism for removing the consumable part from the process module was discussed with reference to FIG. 4. The VTM robot 105 places the used consumable part 208 in the bottom support finger 902b of the finger assemblies 902. In some embodiments, both the top and the bottom support fingers 902a, 902b may be used to transport used or new consumable part 208. In one embodiment, the bottom support finger 902b may be used to only receive the used consumable part 208 and the top support finger 902a may be used to only receive the new consumable part 208, or vice versa. In other embodiments, the receiving of the used and new consumable parts are not restricted to particular one of the support fingers but may be received on any one of the top or the bottom support fingers 902a, 902b. The dynamic alignment is active in the loadlock chamber 110 during the replacement of the consumable part 208.

Once the used consumable part 208 is placed on the support mechanism 901 of the loadlock chamber 110, the airlocks are vented to bring the loadlock chamber 110 to ambient condition. The ATM robot 103 is then activated to remove the consumable part 208 from the loadlock chamber 110 and transfer it to the replacement station 108. In one embodiment, this may include the ATM robot 103 to retrieve the ring carrier (i.e., carrier plate 1104) from the replacement station 108 and use it for retrieving the used consumable part from the loadlock chamber 110. The ATM robot 103 then picks the new consumable part 208 from the replacement station 108 and transfers it to the loadlock chamber 110. After receiving the new consumable part 208, the loadlock chamber 110 is pumped to vacuum. In order to pump the loadlock chamber 110 to vacuum, the loadlock chamber 110 may, in one embodiment, be coupled to a pump through a vacuum control module (not shown) that interfaces with a controller. The controller is used to coordinate action of the pump so as to allow the loadlock chamber 110 to be pumped to vacuum when the new consumable part 208 is to be moved through the VTM 104 into the process module 112. Once the loadlock chamber 110 is set to vacuum state, the VTM robot 105 is activated to pick the consumable part 208 from the loadlock chamber 110 and transport it to the process module 112. In one embodiment, access to the loadlock chamber 110 is controlled through a gate valve that interfaces between the VTM 104 and the loadlock chamber 110. Similarly, access to the process module 112 through the VTM 104 may be controlled through a second gate valve, such as an isolation valve, as discussed with reference to FIG. 5C. The second gate valve may be operated using a sensor mechanism. As the dynamic alignment is active during the replacement of the consumable part 208, when the VTM robot 105 picks the consumable part 208 from the loadlock chamber 110, it picks the consumable part 208 with the dynamic alignment correction and places it into the process module 112. The lift pin mechanism in the process module 112 extends the lift pins to receive the consumable part 208, positions the consumable part 208 in installed state, and then retracts the lift pins inside a housing (e.g., lift pin housing). In one embodiment, replacement of the consumable parts 208 in more than one process module 112-120 (alternately termed "process chamber") may be handled sequentially one at a time, using this process.

Figure 11:
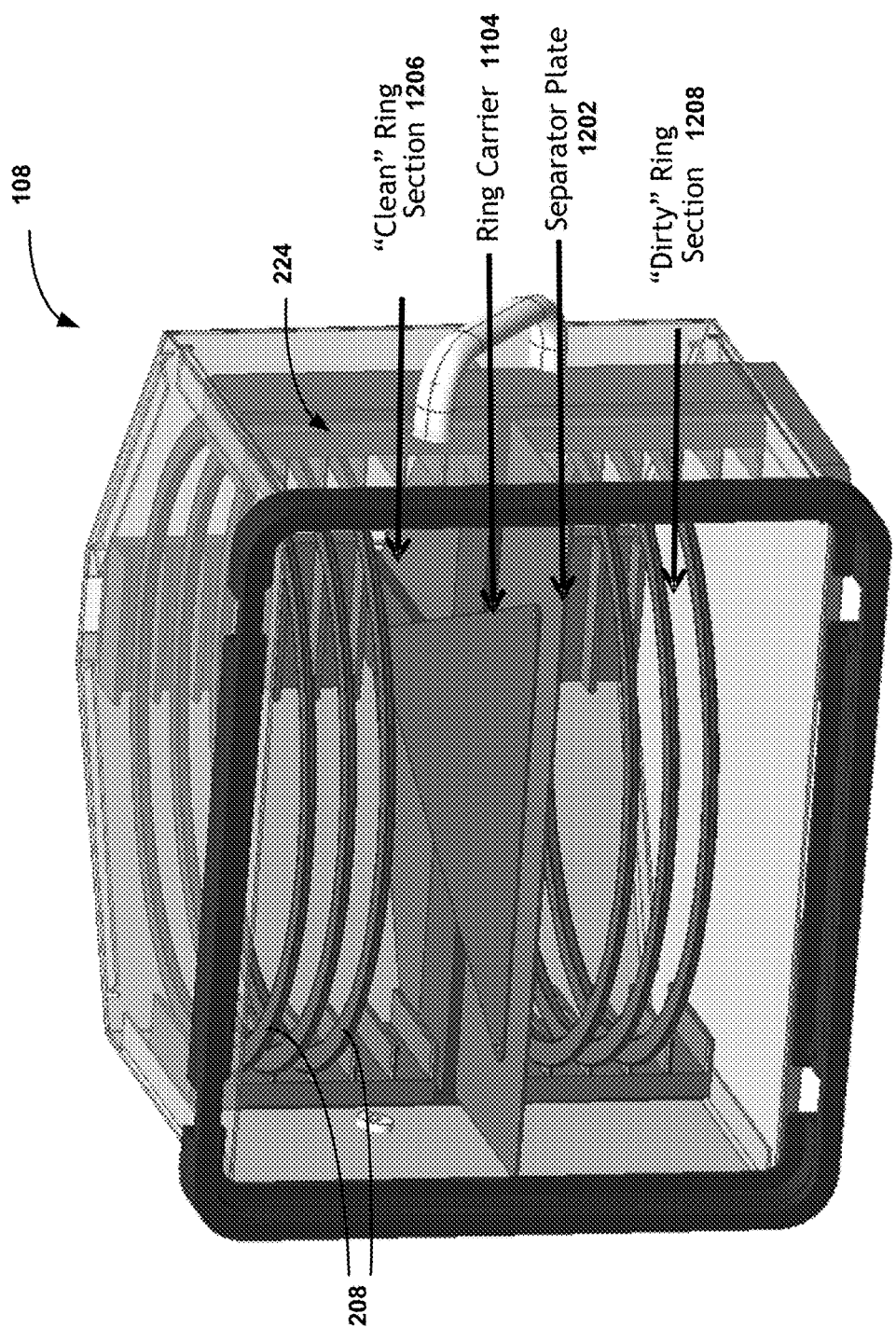
FIG. 11 illustrates an example replacement station used for storing consumable part and a ring carrier, in accordance with an embodiment of the invention.

FIG. 11 illustrates an example replacement station 108 that is used to store new and used consumable parts 208, in one embodiment. In one embodiment, the replacement station 108 may be similar in structure to a wafer loader and include a part buffer 224 with a plurality of compartments 207 to store the consumable part 208. In one embodiment, the part buffer includes a "clean" or "new" consumable part section 1206 for receiving and storing new consumable parts 208, and a "dirty" or "worn" consumable part section 1208 for receiving and storing used and worn, possibly contaminated consumable part 208. A separator plate 1202 may be provided in the replacement station 108 to separate the clean consumable part section 1206 and the dirty consumable part section 1208. In one embodiment, a ring carrier in the form of carrier plate 1104 may be stored in a housing provided within the replacement station. In one embodiment, the housing for the carrier plate 1104 may be provided within the clean or new consumable part section 1206. The housing for the carrier plate 1104 may be provided at the bottom, at the top or anywhere in-between the bottom and the top of the clean or new consumable part section 1206. In an alternate embodiment, the carrier plate 1104 may be housed in the dirty or worn consumable part section 1208. The housing for the carrier plate 1104 may be provided at the bottom, at the top or anywhere in-between the bottom and the top of the dirty or worn consumable part section 1208. In some embodiments, the replacement station 108 may house two carrier plates 1104—one within the clean or new consumable part section 1206 and the other within the dirty or worn consumable part section 1208, so that the new and the used consumable parts may be separately transferred between the replacement station and the loadlock chamber 110. In alternate embodiments, instead of or in addition to a replacement station 108, one or more sections may be defined within the ATM 102 to store used and new consumable parts. In such embodiments, the consumable parts may be delivered and removed from the ATM 102 using the replacement station 108 and the robot in the ATM 102 or with other means of delivery and removal.

Figure 12:
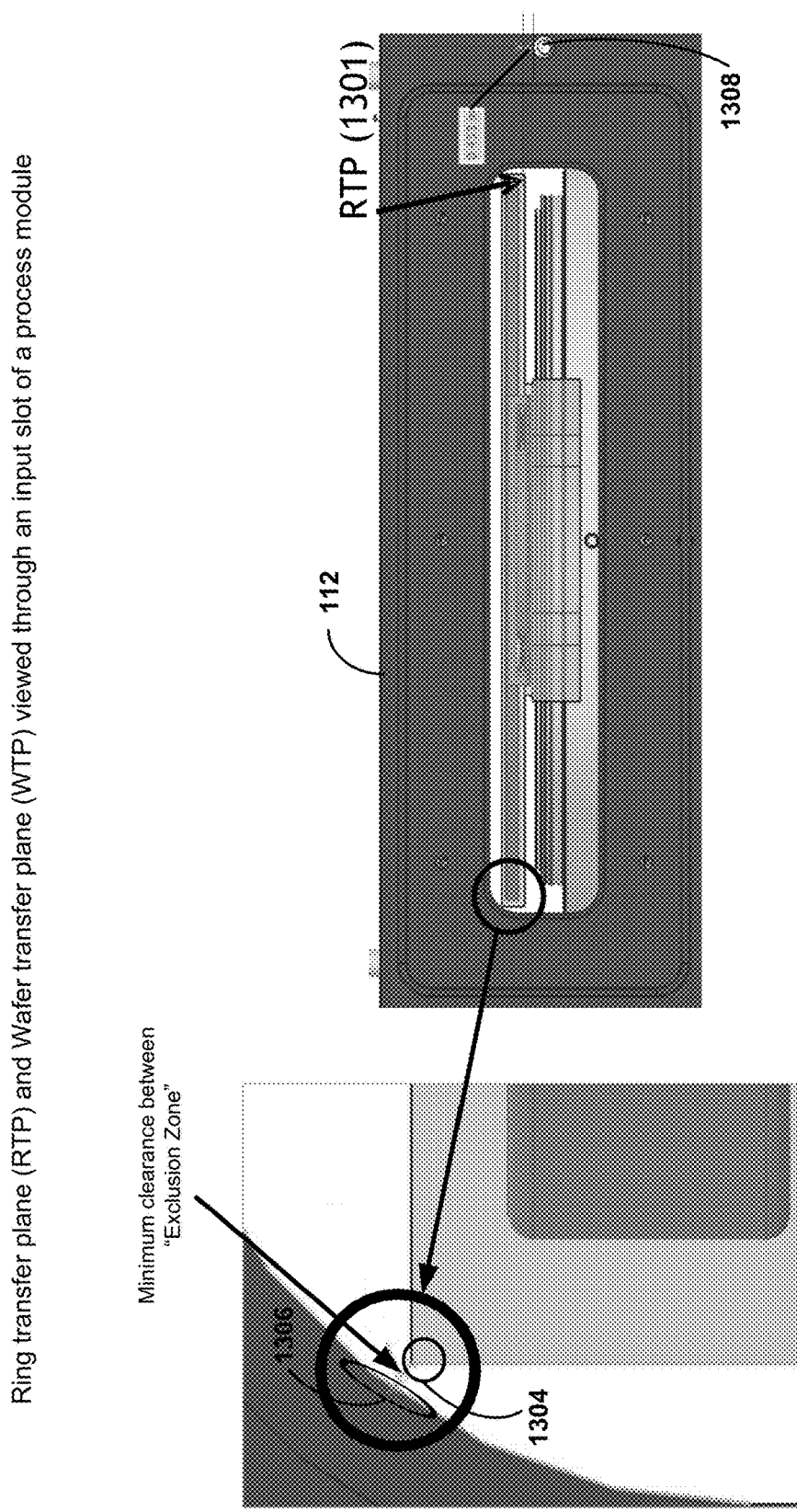
FIG. 12 illustrates an example view of a slot within a process module through which a consumable part or a wafer is moved into and out of the process module, in one embodiment of the invention.

FIG. 12 illustrates an example slot view into a process module in which a consumable part is being received, in one embodiment. The consumable part is received along a ring transfer plane (RTP) 1301 that is located above a set of chamber interface pins 1308 within the process module 112, for example. In some embodiments, the RTP 1301 is defined to be above the chamber interface pins (CIPs) 1308. In certain embodiments, the height of the consumable part above a top surface of an electrostatic chuck (ESC) that is disposed in the process module 112, is defined to allow sufficient clearance for the consumable part to move into and out of the process module 112 without any interference. In such embodiments, the clearance ensures that the consumable part, the end effector mechanism with the armset is able to fit through the slot opening of the process module 112. Since the slot opening is designed for wafer transfers, the consumable part size may be limited by the slot size. When a wider consumable part is to be transferred, a segmented consumable part may be used to fit into the existing slot opening of the process module 112 instead of redesigning the slot opening. In specific examples, a relative height of the ESC biases the consumable part toward the top of the slot. Due to the specific size of the slot corner radius, there may be a trade-off between consumable part height and diameter. To ensure sufficient clearances are found all around, a tolerance zone may be defined around the consumable part and robot to represent the combined volume during transfer. The tolerance zone will have to take into account load deflection effects, robot arm trajectory error, leveling error effects, and other factors. In some embodiments, the clearances above, below and to the sides of the nominal ring transfer path can be as little as a few millimeters or less.

In some embodiments, the RTP is different from the wafer transfer plane (WTP). In such embodiments, the WTP is defined to be above the CIPs 1308 and the RTP, when the wafer is being transferred into and out of the process module 112. In some embodiments, a minimum clearance is defined between the exclusion zone 1304 of the consumable part 208 and the inner corner radius 1306 of an opening into the process module 112 through which the wafer and the consumable part are transported. In some embodiments, the minimum clearance may be a few millimeters in dimension. This minimal clearance allows the consumable part to be moved into and out of the process module 112 without any part of the process module 112 interfering in the transfer of the consumable part.

The various embodiments have been described defining an end effector mechanism employed within robots of a ATM 102 and VTM 104 that are used to transport a wafer to also transport a consumable part. In some embodiments, the end effector mechanism is re-designed so that the finger assembly extends beyond the edge of a wafer so as to allow support of the consumable part. In alternate embodiments, an existing end effector mechanism is used to transport the consumable part. In such embodiments, an intermediate fixture, in the form of a ring carrier, is used temporarily, during consumable part transfer to support the consumable part, as the existing end effector mechanism is not designed to support the consumable part. The finger assemblies within the loadlock chamber are re-designed to support the consumable part. The re-designed end effector mechanism and the finger assembly have a plurality of contact pads to define mutually exclusive contact points for wafers and consumable parts to avoid cross contamination. The contact pads (consumable contact pads, wafer contact pads) may be designed so as to provide contact points at different heights or radial distances to accomplish exclusive separation within expected wafer or consumable part position error.

The consumable part may oftentimes exceed a diameter, thickness, and weight of a wafer. Therefore, addition of consumable part transfer to tools that are not initially designed for such transfer, is limited by clearances within the existing hardware. Additional payload induced deflection reduces the clearances further. So, in order to accommodate the increase in payload and reduce deflection, the end effector mechanism may be made of higher stiffness materials, such as ceramics, to limit increase in deflection or thickness, while reducing total payload on the robot using the re-designed end effector mechanism. Various contact pads (wafer, consumable contact pads) are defined on the surface of the finger assembly within the end effector mechanism to support the consumable part within expected positional error ranges and possibly with varied bottom surface profiles. The same alignment inputs used for centering the wafers may also be used to position and center the consumable part. The consumable parts may be delivered to and removed from the cluster tool assembly via a standard wafer FOUP load port defined in the ATM. A replacement station that is used for delivering and removing consumable part, is designed to be similar to the FOUP design used for delivering wafers. The replacement station can be temporarily mounted to the load port of the ATM manually or by an automated system, such as an overhead track FOUP delivery system. This temporary mounting allows replacement of the consumable part without displacing or consuming other wafer storage or processing hardware on the ATM (i.e., wafer buffers, cool stations, integrated metrology, etc.). In alternative embodiments, the consumable parts may be received into the ATM via the replacement station, stored temporarily within the ATM separate from the load port and retrieved when the consumable part needs to be replaced. The various embodiments described herein provide an efficient, cost-effective way of replacing the consumable part within a cluster tool assembly without breaking the vacuum seal, thereby allowing the cluster tool assembly to have a shorter downtime. Reduced downtime of the cluster tool assembly would result in improved wafer throughput.

Figure 13:
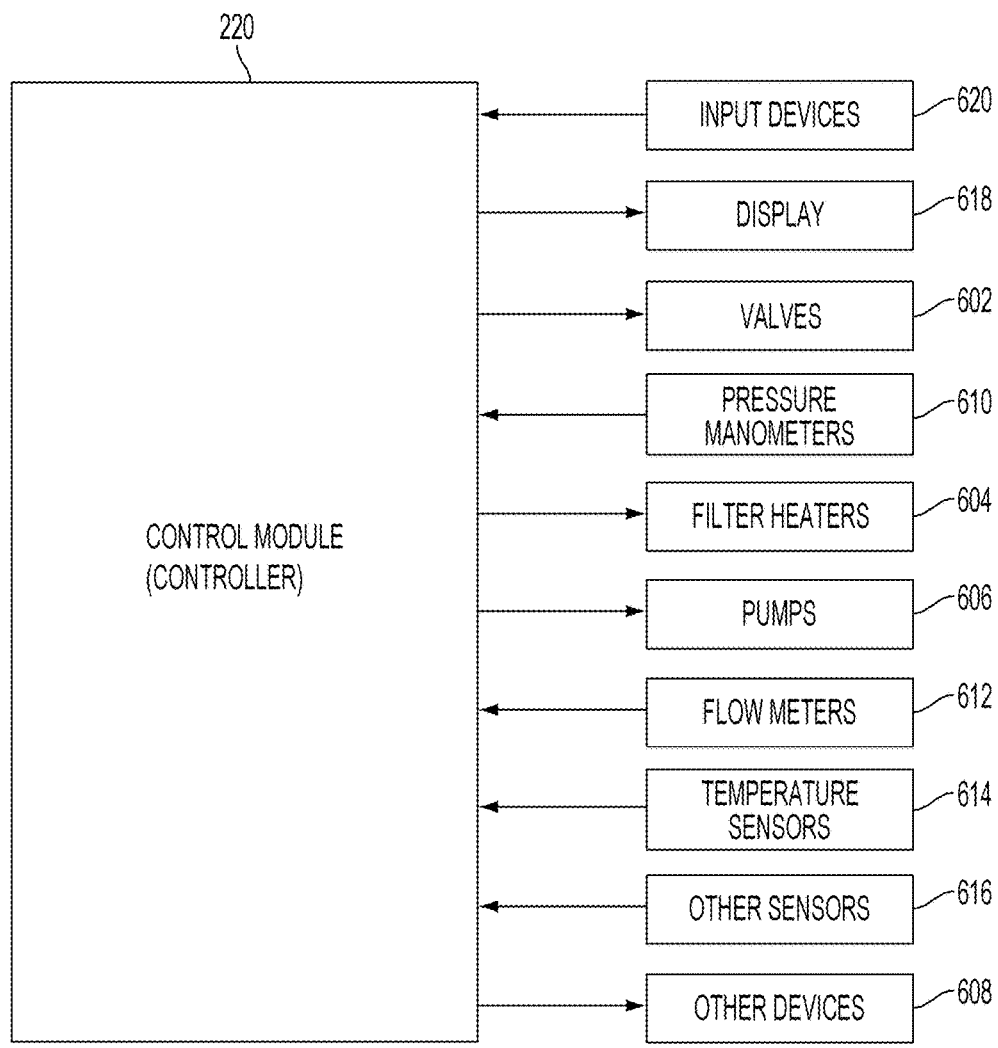
FIG. 13 illustrates a control module (i.e., a controller) for controlling various aspects of a cluster tool, in accordance with one embodiment.

FIG. 13 shows a control module (also referred to as a "controller") 220 for controlling the cluster tool assembly described above. In one embodiment, the controller 220 may include some example components, such as a processor, memory and one or more interfaces. The controller 220 may be employed to control devices in a cluster tool assembly 100 based in part on sensed values. For example only, the controller 220 may control one or more of valves 602 (including isolation valves 216, 216' of FIGS. 5A, 5B, 5C), filter heaters 604, pumps 606 (including pump 233), and other devices 608 based on the sensed values and other control parameters. The controller 220 receives the sensed values from, for example only, pressure manometers 610, flow meters 612, temperature sensors 614, and/or other sensors 616. The controller 220 may also be employed to control process conditions during precursor delivery and deposition of a film. The controller 220 will typically include one or more memory devices and one or more processors.

The controller 220 may control activities of the precursor delivery system and deposition apparatus. The controller 220 executes computer programs including sets of instructions for controlling process timing, delivery system temperature, pressure differentials across the filters, valve positions, robots and end effectors, mixture of gases, chamber pressure, chamber temperature, wafer temperature, RF power levels, wafer chuck or pedestal position, and other parameters of a particular process. The controller 220 may also monitor the pressure differential and automatically switch vapor precursor delivery from one or more paths to one or more other paths. Other computer programs stored on memory devices associated with the controller 220 may be employed in some embodiments.

Typically there will be a user interface associated with the controller 220. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module (i.e., controller) parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber or process module components necessary to carry out the inventive deposition processes. Examples of programs or sections of programs for this purpose include substrate positioning code, process gas control code, pressure control code, heater control code, plasma control code, lift mechanism control code, robot position code, end effector position code and valve position control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck. The valve position control code may include code to control access to a process module or the cluster tool assembly by controlling isolation valves that provide access to the process module or the cluster tool, for example. The lift mechanism control code may include code to activate the actuator drive to cause the actuators to move the lift pins, for example. The robot position code may include code to manipulate the position of the robot(s) including manipulation of the robot to move along a lateral, a vertical, or a radial axis, for example. The end effector position code may include code to manipulate the position of the end effector including manipulation of the robot to extend, contract, or move along a lateral, a vertical or radial axis, for example.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

The various embodiments described herein allow the consumable parts to be replaced in a fast and efficient manner without having to open the cluster tool assembly to atmospheric conditions. As a result, the time to replace consumable parts, as well as any risk of contaminating the chamber during replacement of consumable parts is greatly reduced, thereby allowing the cluster tool assembly to come online faster. Further, risk of inadvertent damage to the process module, the consumable part and to other hardware components in the process module are greatly reduced.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A front opening ring pod (FORP) for holding consumable parts used in a processing tool, comprising:
    a plurality of compartments for holding consumable parts in a vertically stacked orientation within the FORP;
    a plurality of ledges disposed along internal sidewalls of the FORP provide shelves for supporting the consumable parts in the vertically stacked orientation;
    a separator plate disposed within the FORP, providing a horizontal plane that divides an inside region of the FORP into an upper region and a lower region, such that each of the upper region and the lower region include a group of said shelves for holding the consumable parts; and
    a vent defined in a base of the FORP, the vent provides a path for gases out of the lower region of the FORP.

2. The FORP of claim 1, wherein a sidewall of the FORP includes an opening with a door frame, the opening is configured to receive a door, and the opening is sized to provide access in and out for the consumable parts.

3. The FORP of claim 1, wherein the upper region is configured to store consumable parts that are to be delivered to one or more process modules of the processing tool, and the lower region is configured to store consumable parts retrieved from the one or more process modules of the processing tool.

4. The FORP of claim 1, wherein the FORP is defined by a molded plastic shell.

5. The FORP of claim 4, wherein the plurality of ledges are disposed within the internal sidewalls of the molded plastic shell of the FORP.

6. The FORP of claim 1, wherein each of the consumable parts is an edge ring that is configured to surround a substrate support of one or more process modules of the processing tool.

7. The FORP of claim 1, wherein the FORP is configured to be interfaced with a load port that couples to an atmospheric transfer module of the processing tool.

8. The FORP of claim 1, further includes a carrier plate receiving structure defined on a top surface of the separator plate, the carrier plate receiving structure configured to store a carrier plate used to move the consumable parts into and out of the FORP.

9. The FORP of claim 8, wherein the group of said shelves along the internal sides of the upper region are disposed starting at a height that is greater than a height of the carrier plate receiving structure.

10. The FORP of claim 8, further includes a second carrier plate receiving structure defined on a top surface of the base, the second carrier plate receiving structure configured to store a second carrier plate used to move the consumable parts into the FORP.

11. The FORP of claim 10, wherein the group of said shelves along the internal sides of the lower region are disposed starting at a height that is greater than a height of the second carrier plate receiving structure.

12. A front opening ring pod (FORP) for holding consumable parts used in a processing tool, comprising:
    a plurality of compartments for holding consumable parts in a vertically stacked orientation within the FORP;
    a plurality of ledges disposed vertically along internal lateral sidewalls and an internal back sidewall of the FORP, defining shelves for supporting the consumable parts in the vertically stacked orientation;
    an opening with a door frame provided on a front sidewall of the FORP, the opening is configured to receive a door, the opening is sized to provide access in and out for the consumable parts held in the FORP;
    a separator plate disposed within the FORP, provides a horizontal plane that divides an inside region of the FORP into an upper region and a lower region, wherein each of the upper region and the lower region include a group of said shelves for holding the consumable parts; and
    a vent defined in a base of the FORP, the vent provides a path for gases out of the lower region of the FORP.

13. The FORP of claim 12, wherein the door includes a plurality of ledges disposed vertically along an inside wall, the plurality of ledges defining shelves for providing additional support to the consumable parts received in the vertically stacked orientation, when the door is engaged, the plurality of ledges of the door aligning with the plurality of ledges disposed along the internal lateral sidewalls and the internal back sidewall.

14. The FORP of claim 12, wherein each of the consumable parts is an edge ring that is configured to surround a substrate support of one or more process modules of the processing tool.

15. The FORP of claim 12, wherein the back sidewall of the FORP is contoured, wherein the contour is defined by a back portion that is oriented parallel to the front sidewall of the FORP and an angled portion extending between each of the lateral sidewalls and the back portion.

16. The FORP of claim 12, further includes a carrier plate receiving structure disposed in the upper region used to store consumable parts that are to be delivered to one or more process modules within the processing tool, the carrier plate receiving structure configured to store a carrier plate used to move the consumable parts out of the FORP.

17. The FORP of claim 16, wherein the carrier plate receiving structure is disposed on a top surface of the separator plate or on an underside of a top surface of the FORP.

18. The FORP of claim 16, further includes a second carrier plate receiving structure disposed in the lower region used to store consumable parts that are retrieved from the one or more process modules, the second carrier plate receiving structure configured to store a second carrier plate used to move the consumable parts into the FORP.

19. The FORP of claim 18, wherein the second carrier plate receiving structure is disposed on a top surface of the base of the FORP or on an underside surface of the separator plate.

20. The FORP of claim 12, wherein the FORP is defined by a molded plastic shell, and wherein the plurality of ledges is disposed within the internal lateral sidewalls and the internal back sidewall of the molded plastic shell of the FORP.

* * * * *